(12) United States Patent
Retzker et al.

(10) Patent No.: US 11,953,457 B2
(45) Date of Patent: Apr. 9, 2024

(54) METHOD FOR PROCESSING SPIN MAGNETOMETRY DATA

(71) Applicant: YISSUM RESEARCH DEVELOPMENT COMPANY OF THE HEBREW UNIVERSITY OF JERUSALEM LTD., Jerusalem (IL)

(72) Inventors: Alexander Retzker, Jerusalem (IL); Zohar Ringel, Jerusalem (IL); Netanel Aharon, Tel Aviv (IL)

(73) Assignee: YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 262 days.

(21) Appl. No.: 17/272,798

(22) PCT Filed: Sep. 5, 2019

(86) PCT No.: PCT/IL2019/050996
§ 371 (c)(1),
(2) Date: Mar. 2, 2021

(87) PCT Pub. No.: WO2020/049568
PCT Pub. Date: Mar. 12, 2020

(65) Prior Publication Data
US 2021/0318256 A1    Oct. 14, 2021

Related U.S. Application Data

(60) Provisional application No. 62/727,616, filed on Sep. 6, 2018.

(51) Int. Cl.
*G01N 24/10*  (2006.01)
*G01R 33/26*  (2006.01)
*G06N 3/045*  (2023.01)

(52) U.S. Cl.
CPC ............. *G01N 24/10* (2013.01); *G01R 33/26* (2013.01); *G06N 3/045* (2023.01)

(58) Field of Classification Search
CPC ......... G01N 24/10; G01R 33/26; G06N 3/045
See application file for complete search history.

(56) References Cited

U.S. PATENT DOCUMENTS

2020/0158669 A1 * 5/2020 Plenio .................... G01N 24/10

OTHER PUBLICATIONS

Aslam et al; "Nanoscale nuclear magnetic resonance with chemical resolution" Science 357, pp. 67-71. (2017).

(Continued)

*Primary Examiner* — Jay Patidar
(74) *Attorney, Agent, or Firm* — The Roy Gross Law Firm, LLC; Roy Gross

(57) ABSTRACT

The present invention provides method for processing spin magnetometry data of a sample, said data generated with a point defects-based spin magnetometer, and for providing information on the presence and properties of a particular compound in the sample, wherein said method comprises:
(1) Subjecting the sample to a spin magnetometry measurement with the point defects-based spin magnetometer to generate a string or an array of the spin measurement results of said sample, said string or an array of the spin measurement results is an input for an external memory; and
(2) Applying a deep-learning method on said spin measurement results in the external memory to output a single bit whose value is '0' or '1', or an array of bits, or an array of integers, or an array of complex numbers, wherein said single bit, or said array of bits, or said array of integers, or said array of complex numbers corresponds to an estimated frequency and/or an amplitude of the input, thereby providing information on the presence and properties of said compound in the sample.

20 Claims, 8 Drawing Sheets

(56) References Cited

OTHER PUBLICATIONS

Aharon et al "NV center based nano-NMR enhanced by deep learning" Cornell University Library, 201 OLIN Library Cornell University Ithaca NY. (2018).
Schwartz et al; "Blueprint for nanoscale NMR" Scientific Reports | Cornell University Library, 201 OLIN Library Cornell University Ithaca NY. (2017).
Santagati et al; "Magnetic-Field Learning Using a Single Electronic Spin in Diamond with One-Photon Readout at Room Temperature" Cornell University Library, 201 OLIN Library Cornell University Ithaca NY. (2018).
International Search Report of PCT/IL2019/050996 Completed Jan. 17, 2020; dated Jan. 28, 2020 3 pages.
Written Opinion of PCT/IL2019/050996 Completed Jan. 17, 2020; dated Jan. 28, 2020 12 pages.

* cited by examiner

METHOD FOR PROCESSING SPIN MAGNETOMETRY DATA

This application is a National Phase of PCT Patent Application No. PCT/IL2019/050996 having International filing date of Sep. 5, 2019, which claims the benefit of priority of U.S. Provisional Patent Application No. 62/727,616, filed Sep. 6, 2018, the contents of which are all incorporated herein by reference in their entirety.

TECHNICAL FIELD

The present application relates to the field of spin magnetometry. In particular, the present application relates to use of deep-learning methods in processing spin magnetometry data generated with a point defects-based spin magnetometer.

BACKGROUND

In conventional NMR spectroscopy, large high-field superconducting magnets are used to increase polarisation of nuclear spins and sensitivity of inductive detection. Since the inductive detection is sensitive to the first-time derivative of a magnetic flux, sensitivity of the induction detection scales with detected frequency, which increases with the strength of the applied magnetic field. Unfortunately, the use of these large magnets also increases the cost and significantly limits portability of NMR instrumentation, and versatility and applicability of NMR spectroscopy. In order to move away from high magnetic fields, to miniaturise the NMR instrumentation and thus make it available for measuring small amounts of chemical and biological compounds in field applications and in point-of-care diagnostics, either hyperpolarisation techniques and/or more sensitive detection methods are required.

Breiland, Harris and Pines in "*Optically-detected electron spin echo and free precession in molecular excited states*", Physical Review Letters 30, 158-161 (1972), first demonstrated optical detection of electron precession and electron spin echoes by monitoring phosphorescence of excited triplet states. Optical methods to enhance sensitivity and resolution of NMR spectroscopy from low to zero magnetic field has since been used to study polarisation of nuclear spins in semiconductors and also for direct detection of local magnetic fields, which is described in detail, for example, in the article by Tycko et al, "*Electronic states in gallium-arsenide quantum-wells probed by optically pumped NMR*", Science 268, 1460-1463 (1995). Recently, Theis et al in "*Parahydrogen-enhanced zero-field nuclear magnetic resonance*", Nature Physics, 7, 571-575 (2011), have demonstrated the relaxometry measurements with alkali vapor magnetometers at earth's field and have obtained zero-field NMR spectra via optical detection methods.

Compared to inductive detection methods, optical detection is much more sensitive, has a higher detection bandwidth at low field and can be successfully used to detect significantly smaller ensembles of the nuclear spins. Initially, Dolde et al in "*Sensing electric fields using single diamond spins*", Nature Physics 7, 459-463 (2011), demonstrated that diamond defect centre spins can be switched between electric and magnetic field sensing modes and can be used to identify suitable parameter ranges for both detector schemes.

In general, there are many different point defects or imperfection in lattice structures that are responsible for polarising electron spins. Point defects are actually the smallest cavities in the lattice that has dimensions about the wavelength of light. As a result, they are capable of confining light strongly and is sufficient for lots of applications, such as nanofilters, low threshold nanolasers and photonic chips. Point defects are created where an atom is missing or is in an irregular place in the lattice structure. They therefore occur only at or around a single lattice point and they are not extended in space in any dimension. For historical reasons, many point defects, especially in ionic crystals, are called "centres", for example a vacancy in many ionic solids is called a luminescence centre, a colour centre, or F-centre.

Point defects include self-interstitial atoms, interstitial impurity atoms, substitutional atoms and vacancies. A self-interstitial atom is an extra atom that has crowded its way into an interstitial void in the crystal structure. Self-interstitial atoms occur only in low concentrations in metals because they distort and highly stress the tightly packed lattice structure.

A substitutional impurity atom is an atom of a different type than the bulk atoms, which has replaced one of the bulk atoms in the lattice. Substitutional impurity atoms are usually close in size (within approximately 15%) to the bulk atom. An example of substitutional impurity atoms is zinc atoms in brass. In brass, zinc atoms with a radius of 0.133 nm have replaced some of the copper atoms, which have a radius of 0.128 nm.

Interstitial impurity atoms are much smaller than the atoms in the bulk matrix. Interstitial defects are atoms that occupy a site in a lattice at which there is usually not an atom. They are generally high energy configurations. Small atoms (mostly impurities) in some crystals can occupy interstices without high energy, such as hydrogen in palladium. Interstitial impurity atoms fit into the open space between the bulk atoms of the lattice structure. An example of interstitial impurity atoms is the carbon atoms that are added to iron to make steel. Carbon atoms, having an atomic radius of 0.071 nm, fit nicely in the open spaces between the larger (0.124 nm) iron atoms.

Vacancy defects are lattice sites which would be occupied by an atom in a perfect lattice but are vacant. They are common, especially at high temperatures when atoms are frequently and randomly change their positions leaving behind empty lattice sites. In most cases diffusion (mass transport by atomic motion) can only occur because of vacancies. If a neighbouring atom moves to occupy the vacant site, the vacancy moves in the opposite direction to the site which used to be occupied by the moving atom. The stability of the surrounding crystal structure guarantees that the neighbouring atoms will not simply collapse around the vacancy. In some materials, neighbouring atoms actually move away from a vacancy, because they experience attraction from atoms in the surroundings. A vacancy (or pair of vacancies in an ionic solid) is sometimes called a Schottky defect. A nearby pair of a vacancy and an interstitial is often called a Frenkel defect or Frenkel pair. This is caused when an ion moves into an interstitial site and creates a vacancy.

Examples of point defects are many. Smallman and Ngan in "*Point Defect Behaviour*", Modern Physical Metallurgy (Eighth Edition), Chapter 6, 251-285 (2014), reviewed point defects, including vacancies, interstitials, dislocation loops, stacking fault tetrahedra and voids, which can form in metals and non-metallic crystals. Point defects in group-III nitrides semiconductor materials were reviewed and discussed by Paskov and Monemar in "*Point defects in group-III nitrides*", published in Defects in Advanced Electronic Materials and Novel Low Dimensional Structures, as a volume in Woodhead Publishing Series in Electronic and Optical Materials, Part 2, 27-61 (2018).

Other non-limiting examples of point defects are for instance, silicon vacancies described by Jantzen et al in "*Nanodiamonds carrying silicon-vacancy quantum emitters with almost lifetime-limited linewidths*", New Journal of Physics 18, 073036 (2016), "STI centres" (the nature of which is still unknown) discovered and reported by Sang-Yun Lee et al in "*Readout and control of a single nuclear spin with a metastable electron spin ancilla*", Nature Nanotechnology 8, 487-492 (2013), germanium vacancies described by Iwasaki et al in "*Germanium-Vacancy Single Colour Centres in Diamond*", Scientific Reports 5, 12882 (2015), defects in boron nitride described by Dietrich et al in their paper "*Narrowband quantum emitters over large spectral range with Fourier-limited linewidth in hexagonal boron nitride*", Physical Review B 98, 081414 (2018), and defects in silicon carbide demonstrated by Wildmann et al in "*Coherent control of single spins in silicon carbide at room temperature*", Nature Materials 14, 164-168 (2015). In addition, rare-earth ions in solids and donors in silicon were described by Awschalom et al in "*Quantum technologies with optically interfaced solid-state spins*", Nature Photonics 12, 516-527 (2018).

Negatively charged nitrogen-vacancy ($NV^-$) centres are point defects in a diamond lattice with unique properties that are favourable for use in ultra-sensitive, high-resolution magnetometry. The NV centre-based NMR spectroscopy recently developed by three groups at ETH Zürich, Ulm University and Harvard University, is making use of these point defects in diamonds. These occur when two adjacent carbon atoms in any carbon lattice are replaced by a nitrogen atom and a vacant site. The spin states of the NV centres, which are exquisitely sensitive to magnetic fields, can be controlled and measured. Whereas traditional coil detectors used in conventional NMR spectroscopy require bulk samples, the atomic-scale NV centres can be placed right next to molecules in the spectroscopy experiments, which are becoming widespread.

The high sensitivity of the NV centres, however, is only realised with defects that are deep enough (typically deeper than 5 nm) from the surface within the diamond lattice to maintain long coherence times. This limitation has a strong consequence on sensing applications given the sensitivity of the NV to magnetic moments, such as nuclear spins, depends on the dipole-dipole interaction. This interaction fades as $r^{-3}$, where r is the separation between the NV and the target magnetic moment. For this reason, detecting nuclear spins requires making trade-offs between using shallow enough NV centres such that they are strongly coupled to external nuclear spins, but deep enough that their coherence times do not drastically limit the moment sensitivity.

Despite these demanding requirements, impressive and rapid progress has been made in detecting nuclear magnetisation using the NV centres-based sensors. In 2013, three groups reported the NMR from (5 $nm^3$) volume samples of $^1H$ spins on a diamond surface. Mamin et al in their signature article "*Nanoscale nuclear magnetic resonance with a nitrogen-vacancy spin sensor*", published in Science 339, 6119, 557-560 (2013), showed that optical detection methods, along with leading to more portable instrumentation, provide a means for investigating the statistical polarisation produced by very small ($10^4$) ensembles of spins. Almost at the same time, Blanchard et al in "*High-resolution zero-field NMR J-spectroscopy of aromatic compounds*", Journal of the American Chemical Society (JACS), 135, 3607-3612 (2013) demonstrated the magnetic resonance phenomena at very low field. Staudacher et al in "*Nuclear magnetic resonance spectroscopy on a (5-nanometer)$^3$ sample volume*", Science, 339, 6119, 561-563 (2013) also showed that optically-pumped rubidium alkali vapor magnetometers and nitrogen-vacancy (NV) diamond magnetometers both achieve high magnetic field sensitivities, and in the case of the magnetometers which are based on the NV diamonds, can be used to detect nuclear spins within single $nm^3$ volumes. More recently, the ETH Zurich group decreased the detection volume to 1.8 $nm^3$ that corresponds to 330 $^1H$ spins as shown in Lorenz et al in "*Nanoscale nuclear magnetic resonance with a 1.9-nm-deep nitrogen-vacancy sensor*", Applied Physics Letters 104, 033102 (2014). Although sensitivity to a single spin of a proton external to the diamond lattice has yet to be reached, it now appears that reaching this milestone is simply a matter of time.

Müller et al in "*Nuclear magnetic resonance spectroscopy with single spin sensitivity*", published in Nature Communications 5, Article number: 4703 (2014), demonstrated strong coupling between an atomic (nitrogen-vacancy) sensor and a sample nucleus to perform nuclear magnetic resonance on four $^{29}Si$ spins. They exploited the field gradient that is created by the diamond atomic sensor, in concert with compressed sensing, to realise imaging protocols, enabling individual nuclei to be located with Ångstrom precision. The achieved signal-to-noise ratio under ambient conditions allowed extremely high nuclear-spin sensitivity to be achieved within seconds.

DeVience et al in "*Nanoscale NMR spectroscopy and imaging of multiple nuclear species*", Nature Nanotechnology 10, 129-134 (2015), described the nanoscale NMR spectroscopy based on using shallow NV centres in diamond of multiple nuclear species ($^1H$, $^{19}F$, $^{31}P$) in non-uniform (spatially structured) samples under ambient conditions and at moderate magnetic fields (about 20 mT) using two complementary sensor modalities: (1) a scanning confocal microscope interrogating single NV centres, and (2) a widefield microscope using a CCD camera to image fluorescence from a high-density NV ensemble in a thin layer near the diamond surface, which is optimal for NMR spectroscopy and imaging over a >10 μm field of view and with sub-micrometre resolution.

Up to now, samples had to be at least three micrometres in size for NMR testing to work. In many cases, this is a serious problem for chemists, who cannot afford sufficient quantities of an unknown substance to identify it with NMR spectroscopy. Also, for biologists, it would be helpful to examine a single protein, to find out how it is folded, for example. The way in which a protein is folded is decisive for certain tasks that it fulfils in the body. While biologists can get this structural information out of the proteins using X-ray crystallography or conventional NMR, these methods are still cumbersome, require heavy and expensive instrumentation with strong magnets (in case of the NMR technique) and countless identical copies of a molecule in order to determine its structure. In 2016, the Harvard and Ulm researchers detected individual protein molecules on the surface of the NV-implanted diamond and inferred structural features by studying changes in the frequencies of the fields detected by the NV centres. This research is described in the article by Lovchinsky et al, "*Nuclear magnetic resonance detection and spectroscopy of single proteins using quantum logic*", Science 351:6275, 836-841 (2016).

A comprehensive review "*Putting a new spin on things*" assessing the state of the art in the field of nano-NMR was published by Tim Wogan on 5 Sep. 2017 in chemistryworld- .com: https://www.chemistryworld.com/news/putting-a-new-spin-on-things/3007039.article.

Thus, the newly developed and rapidly growing point defects-based spin magnetometry introduced above is aimed at reducing minimal NMR samples by many orders of magnitude down to a few molecules. This is achieved by replacing the macroscopic coil of the conventional NMR setup, which measures the magnetic field, by a single or an ensemble of controllable spins (point defects in lattices), which serve as tiny magnetometers. Recent experiments have shown that it can estimate the spectrum of artificial signals and signals of polarised samples with extremely high resolution because of the quantum effects involvement. However, while this field holds great promise, point defects-based spin magnetometry suffers from adverse inherent noise. The obvious advantages of receiving magnetic information about tiny quantities of molecules are masked by an extra amount of noise that goes hand in hand with most configurations of electron spin magnetometers. This noise creates a serious bottleneck in interpreting data generated by electron spin magnetometers, because the crucial information is encoded in the tiny chemical shifts and extremely small energy gaps caused by J-couplings, or other sources of information that indicate chemical specification.

It is very difficult, if even possible, to tackle this noise with conventional data analysis methods. On top of the regular macroscopic NMR noise, the excess noise is due to dynamics, and especially diffusion, which is extremely large and also broadens the line-width above the required resolution. In addition, the precise noise model is usually unknown. Therefore, there is a strong and long-felt need to introduce methods capable of handling the noise from any amount of data which needs to be gathered for a very short period of time.

SUMMARY

The present invention describes embodiments of a method for processing spin magnetometry data of a sample, said data generated with a point defects-based spin magnetometer, and providing information on the presence and properties of a particular compound in the sample, wherein said method comprises:
(1) Subjecting the sample to a spin magnetometry measurement with the point defects-based spin magnetometer to generate a string or an array of the spin measurement results of said sample, said string or an array of the spin measurement results is an input for an external memory; and
(2) Applying a deep-learning method on said spin measurement results in the external memory to output a single bit whose value is '0' or '1', or an array of bits, or an array of integers, or an array of complex numbers, wherein said single bit, or said array of bits, or said array of integers, or said array of complex numbers corresponds to an estimated frequency and/or an amplitude of the input, thereby providing information on the presence and properties of said compound in the sample.

In a particular embodiment, said point defects-based spin magnetometer is a nitrogen-vacancy centres ($NV^-$)-based spin magnetometer, or a germanium-vacancy centres ($GeV^-$)-based spin magnetometer, or a silicon-vacancy centres ($SiV^-$)-based spin magnetometer, or a ST1 centres-based spin magnetometer, or a group-III nitrides-based spin magnetometer, or a silicon carbide-based spin magnetometer.

In a certain embodiment, the string or the array of the spin measurement results of the sample is generated from nuclear magnetic resonance spectrum of nuclear spin moments of the sample placed in a static magnetic field which permeates the sample, and from at least one detection spin moment having a detection region which encloses the latter and extends at least partially into the sample.

In some embodiments, a method for generating the string or the array of the spin measurement results of the sample from nuclear magnetic resonance spectrum of nuclear spin moments of the sample comprises:
1) Placing the sample in a static magnetic field which permeates the sample and polarising or hyperpolarising at least some of the nuclear spin moments of the sample along the magnetic field for creating longitudal magnetisation;
2) Converting said longitudal magnetisation into transverse magnetisation by irradiating frequency pulses with a 90° flip angle, thereby influencing said nuclear spin moments;
3) Irradiating a sequence of high-frequency pulses having an initial pulse and a final pulse onto at least one detection spin moment, thereby influencing said detection spin moment, and subsequently recording a signal of said transverse magnetisation present in a detection region of the sample; and
4) Repeating Step 3) several times in succession, wherein said initial pulse and said final pulse of said each sequence have the same pulse phase.

In a further embodiment, the detection spin moment has the spin quantum number 1 and is prepared in an x state by means of said initial pulse. In another embodiment, said each sequence is generated as a decoupling sequence for the detection spin moment, in which a number of high-frequency pulses with 180° flip angles are provided between said initial pulse and said final pulse.

In yet further embodiment, said detection spin moment is formed by an electron spin moment of a colour centre of a solid body in contact with the sample. In a specific embodiment, said colour centre of the solid body is a nitrogen vacancy centre of a diamond, or a germanium-vacancy centre, or a silicon-vacancy centre, or a ST1 centre, or a group-III nitride centre, or a silicon carbide centre. In another embodiment, repeating Step 3) is carried out simultaneously on a plurality of the detection spin moments.

In a specific embodiment, the deep learning (DL) method used in the present invention employs a fully connected neural network, or a convolutional neural network, or a recurrent neural network, or a resnet, or a network with attention heads. In another embodiment, the DL method of the present invention further comprises the step of training the neural network. In a particular embodiment, the method of the present invention is suitable for measuring the sample at nanomole, picomole, femtomole or attomole sample scales.

In some embodiments, the deep-learning method of the present invention comprises:
1) Feeding the input string into a neural network, wherein the value of node i in an input layer of said neural network is set to the value of bit $x_i$ in said input string, and outputting the values of the nodes of the input layer to subsequent hidden layers of said neural network, wherein said neural network contains an arbitrary number N of the hidden layers, wherein each hidden layer contains an arbitrary number $n_j$ of neurons, wherein each node i of the input layer outputs its value to all neurons j in a subsequent hidden layer, and wherein each neuron j of said hidden layer outputs its value to all neurons j in a subsequent hidden layer of said neural network;

2) Calculation of the output of neurons in each subsequent hidden layer of said neural network, wherein the output of each neuron j in each said hidden layer is calculated as a function $f_j(z_j)$ of its inputs containing all the outputs of its preceding layer, wherein the function $z_j$ is a linear function of said inputs of a neuron j with different parameters for each neuron j, and wherein f (z) is a non-linear activation function; and 3) Calculation of the output of neurons in an output layer, wherein the output of each neuron j in the output layer is calculated as a function $f_s(z)$ of its inputs containing all the outputs of its preceding hidden N-layer, wherein the function $z_j$ is a linear function of said inputs of a neuron j with different parameters for each neuron j, wherein $f_s(z)$ is a non-linear activation function of the output neuron, and wherein the low and high activation levels of each neuron are associated with output labels: $f_s(z)$ larger than a threshold value and $f_s(z)$ less than a threshold value, said two labels correspond to the output values of '1' and '0', respectively.

In a particular embodiment, said output labels correspond to frequency and/or amplitude values of the spin measurement results. An exemplary threshold value is 0.5 but can receive any value between 0 and 1 in the method of the present invention. An exemplary number of hidden layers in the present invention is 2, which results in a particular embodiment of the deep-learning method of the present invention, comprising:

1) Feeding the input string into a neural network, wherein the value of node i in an input layer of said neural network is set to the value of bit $x_i$ in said input string, and each node of the neural network outputs its value to all nodes in a first hidden layer of said neural network;

2) Calculation of the output of neurons in said first hidden layer, wherein the output of each neuron j in the first hidden layer is calculated as a function $f_j(z_j)$ of its inputs containing all the outputs of the input layer, wherein the function $z_j$ is a linear function of said inputs of a neuron j with different parameters for each neuron j, and wherein f(z) is a non-linear activation function;

3) Calculation of the output of neurons in a second hidden layer, wherein the output of each neuron j in said second hidden layer is calculated as a function $f_j(z_j)$ of its inputs containing all the outputs of the first hidden layer, wherein the function $z_j$ is a linear function of said inputs of a neuron j with different parameters for each neuron j, and wherein f(z) is a non-linear activation function; and 4) Calculation of the output of neurons in an output fourth layer, wherein the output of each neuron j in the output layer is calculated as a function $f_s(z)$ of its inputs containing all the outputs of the second hidden layer, wherein the function $z_j$ is a linear function of said inputs of a neuron j with different parameters for each neuron j, wherein $f_s(z)$ is a non-linear activation function of the output neuron, and wherein the low and high activation levels of each neuron are associated with two output frequencies or amplitudes $f_s(z)>0.5$ and $f_s(z)<0.5$, said two frequencies or amplitudes correspond to the output values of '1' and '0', respectively.

In yet further embodiment, the DL method of the present invention is suitable for the frequency and/or amplitude estimation. The frequency estimation carried out by the DL method is based on generalisation or regression of the discrimination problem between two frequencies or amplitudes to a discrimination problem between a few to many frequencies and/or amplitudes, where each frequency or amplitude corresponds to a small frequency or amplitude interval.

In still another embodiment, the neural network of the present invention is suitable for applying an energy-based model, whereby correlations are readily performed of impurities or contaminations in the sample with known compounds or their moieties, whereby new leads are identified without having to perform intermediate and labour-intensive steps of structural and stereochemical determination of known compounds of interest. In said neural network, the deep-learning method of the present invention is capable of performing an additional step of detection of an unknown compound both in chemically impure or pure state.

The present application also relates to a point defects-based spin magnetometer for generating spin magnetometry data of the sample, processing the generated spin magnetometry data of a sample and providing information on the presence and properties of a particular compound in the sample, comprising:

a) a magnet for generating the static magnetic field;
b) a solid or liquid body having point defects with at least one integrated detection spin moment;
c) an antenna element for irradiating the frequency pulses to influence the nuclear spin moments and for irradiating the high-frequency pulses to influence the detection spin moment; and
d) the external memory for carrying out the method of the present invention.

In a particular embodiment, the external memory is a mobile device, wearable gadget, smartphone, smartwatch, desktop computer, server, remote storage, internet storage or internet cloud. The external memory may comprise a processor, or a microcontroller, or a memory-storing controller suitable for storing executable instructions, which when executed by the processor cause the processor to perform the DL method of the present invention.

Various embodiments may allow various benefits and may be used in conjunction with various applications. The details of one or more embodiments are set forth in the accompanying figures and the description below. Other features, objects and advantages of the described techniques will be apparent from the description and drawings and from the claims

BRIEF DESCRIPTION OF THE DRAWINGS

Disclosed embodiments will be understood and appreciated more fully from the following detailed description taken in conjunction with the appended figures. The drawings included and described herein are schematic and are not limiting the scope of the disclosure. It is also noted that in the drawings, the size of some elements may be exaggerated and, therefore, not drawn to scale for illustrative purposes. The dimensions and the relative dimensions do not necessarily correspond to actual reductions to practice of the disclosure.

FIG. 1a shows the time trace signal from one frequency of 250 Hz.

FIG. 1b shows the Fourier transform to the signal shown in FIG. 1a.

FIG. 1c shows the time trace signal from the second frequency of 251.6 Hz.

FIG. 1d shows the Fourier transform to the signal shown in FIG. 1c.

FIG. 5a shows a phase noise, where the random phase of the signal is randomly changed once during a single experiment at a random time interval, so there are two random values of the phase during a single experiment, and the time interval during the experiment in which the phase is changed is also random.

FIG. 5b shows a magnetic noise, where the quantum probe is subjected to a random magnetic field, which is randomly changed once during a single experiment at a random time interval, so there are two random values of the magnetic noise during a single experiment, and the time interval during the experiment in which the magnetic noise is changed is also random.

FIG. 5c shows an amplitude noise, where the amplitude of the signal has a different (random) value in each time interval of a single experiment.

FIG. 5d shows a mixed noise scenario, which includes all of the above noise models.

DETAILED DESCRIPTION

Figure 1A:
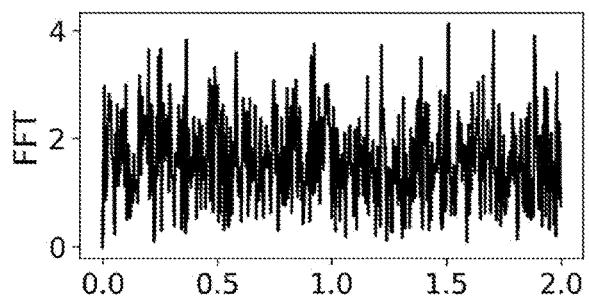
FIGS. 1a-1d show the typical noisy data for two different exemplary frequencies that are aimed to discriminate in the present invention. The signal shown in these figures suffers from a strong phase noise and is read by an NV centre, which adds quantum noise to the output signal.

In the following description, various aspects of the present application will be described. For purposes of explanation, specific configurations and details are set forth in order to provide a thorough understanding of the present application. However, it will also be apparent to one skilled in the art that the present application may be practiced without the specific details presented herein. Furthermore, well-known features may be omitted or simplified in order not to obscure the present application.

The term "comprising", used in the claims, is "open ended" and means the elements recited, or their equivalent in structure or function, plus any other element or elements which are not recited. It should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising x and z" should not be limited to devices consisting only of components x and z. Also, the scope of the expression "a method comprising the steps x and z" should not be limited to methods consisting only of these steps.

Unless specifically stated, as used herein, the term "about" is understood as within a range of normal tolerance in the art, for example within two standard deviations of the mean. In one embodiment, the term "about" means within 10% of the reported numerical value of the number with which it is being used, preferably within 5% of the reported numerical value. For example, the term "about" can be immediately understood as within 10%, 9%, 8%, 7%, 6%, 5%, 4%, 3%, 2%, 1%, 0.5%, 0.1%, 0.05%, or 0.01% of the stated value. In other embodiments, the term "about" can mean a higher tolerance of variation depending on for instance the experimental technique used. Said variations of a specified value are understood by the skilled person and are within the context of the present invention. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges, for example from 1-3, from 2-4, and from 3-5, as well as 1, 2, 3, 4, 5, or 6, individually.

This same principle applies to ranges reciting only one numerical value as a minimum or a maximum. Unless otherwise clear from context, all numerical values provided herein are modified by the term "about". Other similar terms, such as "substantially", "generally", "up to" and the like are to be construed as modifying a term or value such that it is not an absolute. Such terms will be defined by the circumstances and the terms that they modify as those terms are understood by those of skilled in the art. This includes, at very least, the degree of expected experimental error, technical error and instrumental error for a given experiment, technique or an instrument used to measure a value.

As used herein, the term "and/or" includes any and all combinations of one or more of the associated listed items. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached to", "connected to", "coupled with", "contacting", etc., another element, it can be directly on, attached to, connected to, coupled with or contacting the other element or intervening elements may also be present. In contrast, when an element is referred to as being, for example, "directly on", "directly attached to", "directly connected to", "directly coupled" with or "directly contacting" another element, there are no intervening elements present. It will also be appreciated by those of skill in the art that references to a structure or feature that is disposed "adjacent" another feature may have portions that overlap or underlie the adjacent feature.

The present invention describes embodiments of a method for processing spin magnetometry data of a sample, said data generated with a point defects-based spin magnetometer, and providing information on the presence and properties of a particular compound in the sample, wherein said method comprises:
(1) Subjecting the sample to a spin magnetometry measurement with the point defects-based spin magnetometer to generate a string or an array of the spin measurement results of said sample, said string or an array of the spin measurement results is an input for an external memory; and
(2) Applying a deep-learning method on said spin measurement results in the external memory to output a single bit whose value is '0' or '1', or an array of bits, or an array of integers, or an array of complex numbers, wherein said single bit, or said array of bits, or said array of integers, or said array of complex numbers corresponds to an estimated frequency and/or an amplitude of the input, thereby providing information on the presence and properties of said compound in the sample.

The external memory according to the present invention can be, for example, a mobile device, wearable gadget, smartphone, smartwatch, desktop computer, server, remote storage, internet storage, or internet cloud.

As mentioned above in the Background section of the present application, it is extremely difficult, if even possible, to tackle the noise in the data generated with a spin magnetometer with conventional data analysis methods. On top of the regular macroscopic NMR noise, the excess noise is due to dynamics, and especially diffusion, which is extremely large and also broadens the line-width above the required resolution. In addition, the precise noise model is usually unknown.

The present inventors surprisingly found that machine deep learning (DL) methods are capable of learning the noise model from a small amount of data which only needs to be gathered for a few minutes. That means a DL algorithm can analyse a test signal with the same efficiency as numerically demanding Bayesian methods that rely on precise knowledge of the model. Moreover, the present invention demonstrates that DL methods are extremely useful in handling challenging frequency resolution problems and in outperforming Bayesian methods even under assumptions that the Bayesian methods have full knowledge of the model and possess infinite computing power. Thus, besides being numerically much less demanding than Bayesian methods, the advantage of deep learning methods is also indicated by their superior performance in frequency discrimination of the experimental data, where the signal and noise models are not fully known.

The present invention utilises a "quantum probe", which is, for example, a nitrogen-vacancy (NV) centre in a single diamond or in a diamond assembly, or a germanium-vacancy centre, or a silicon-vacancy centre, or a ST1 centre, or a group-III nitride centre, or a silicon carbide centre. This centre serves as a tiny magnetometer which is placed in the proximity of a sample that contains at least two known molecules between which the method of the invention should discriminate. Using the quantum probe, the present invention classifies frequencies and/or amplitudes of the obtained signals generated in the spin magnetometry experiments. In these experiments, a quantum probe, which is first initialised, freely evolves for a short duration under the presence of the signal and is then being measured. The measurement is performed by a series of linked magnetometry sequences, a projective detection or readout step respectively being provided between the sequences. This means that the sequence and the detection step are carried out several times repeatedly in succession. The sequences are in this case all carried out identically as a series of high-frequency pulses with an initial pulse and with a final pulse, which are irradiated onto the quantum probe spin moment. The sequences and the detection step are in this case synchronised with an external clock.

The initial and final pulses of the sequences are in this case configured as high-frequency pulses, for example, $\pi/2$ high-frequency pulses with a 90° flip angle, the phases of the initial and final pulses respectively being offset by 90° relative to each another. It means that the initial pulses are configured as high-frequency pulses with a 90° flip angle along a first pulse axis, for example the X pulse axis, the final pulses being configured as high-frequency pulses with a 90° flip angle along a second pulse axis oriented perpendicularly to the first pulse axis (X), for example a Y pulse axis. By these sequences, the detection spin moment is in this case read out in a Y measurement basis, so that the probability of measuring a state $P_{\downarrow Y}$ scales with $\sin^2(\varphi+\pi/4)$, where value q. is the phase evolution recorded by the detection spin moment during a sequence. Such a measurement in the Y measurement basis therefore has the experimental advantage that the measurable signal for the typically low phase evolution ($\varphi \ll 1$) is linearly dependent on yo. Disadvantageously, in the case of measurement over a macroscopic sample region or measurement region, this linear term causes noise due to magnetic fluctuations inside the sample, which consequently leads to degradation of the measurable signal.

An exemplary spin magnetometry method used in the present invention is suitable for generating spin magnetometry data of nuclear spin moments of a sample in a sample environment. In this method, a static magnetic field is provided, which permeates the sample and the sample environment and therefore excites the nuclear spin moments located there into Larmor precession. The sample is, for example, a molecule which is located in an aqueous sample environment. In this case, for example, the sample and the sample environment have hydrogen nucleus spin moments, the hydrogen nucleus spin moments of the molecule having a Larmor frequency different from the hydrogen nucleus spin moments of the sample environment because of chemical shifting.

In order to record the Larmor precessions of nuclear spin moments, at least one detection spin moment having a detection region which encloses the latter is provided, the detection region extending at least partially into the sample and into the sample environment. The detection spin moment is in this case preferably likewise located in the magnetic field and is in suitably a spin moment different from the nuclear spin moments, for example a nuclear spin moment of a different nuclear spin type or, in particular, an electron spin moment. As a result of this, the nuclear spin moments of the sample and the detection spin moment have different Larmor frequencies, or resonant frequencies, from one another.

In the exemplary spin magnetometry method used in the present invention, an antenna element is provided, by means of which the at least one detection spin moment and the nuclear spin moments can be manipulated. The antenna element, configured for example as a wire or micro-structured conductive track, is in this case suitable and adapted for irradiating frequency pulses in order to influence the nuclear spin moments and high-frequency pulses in order to influence the detection spin moment. The frequency pulses in this case suitably have a signal frequency which corresponds to the Larmor frequency of the nuclear spin moments. During irradiation of each frequency pulse, the nuclear spin moments are therefore resonantly excited. Correspondingly, the high-frequency pulses suitably have a signal frequency corresponding to the Larmor frequency of the detection spin moment, so that resonant, in particular coherent, manipulation and influencing of the detection spin moment are possible.

The exemplary spin magnetometry method of the present invention comprises several steps. In a first method step, at least some of the nuclear spin moments are polarised along the magnetic field for longitudinal magnetisation. This polarisation may, for example, be a Boltzmann (thermal) polarisation. In a subsequent second method step, the longitudinal magnetisation is converted into transverse magnetisation by irradiating a frequency pulse with a 90° flip angle. In a third method step, a sequence of high-frequency pulses with an initial pulse and with a final pulse is irradiated onto the detection spin moment, and a signal of the transverse magnetisation present in the detection region is subsequently recorded. The transverse magnetisation Larmor-precessing in the magnetic field in this case causes a detectable spin signal in the detection region, which signal can be detected or recorded by the detection element of the spin magnetometer by means of the sequence. The signal is in this case, in particular, a phase imposed on a Larmor precession, caused during the sequence, of the detection spin moment.

In other words, the detection spin moment is, for example, set by means of the sequence into a superposition state, the temporal evolution or dynamics of which are influenced during the sequence by the signal of the transverse magnetisation. In particular, the superposition state in this case assumes a phase caused by the transverse magnetisation, so that by readout or recording of a final state of the detection spin moment at the end of the sequence, the signal of the transverse magnetisation is recorded. The third method step is in this case carried out several times repeatedly in succession. These third steps therefore form a series of linked magnetometry sequences, a detection or readout step respectively being provided between the sequences.

The initial pulse and the final pulse of each sequence of high-frequency pulses in this case respectively have the same pulse phase. This means that the initial and final pulses are generated along the same pulse axis. Because of the equal phases, the detection spin moment is in this case read out in an X measurement basis, so that the probability of measuring a state $P_{\downarrow X}$ of the detection spin moment scales with $\sin^2(\varphi)$. The measurable signal therefore does not have a linear term, so that noise is completely suppressed over relatively large measurement regions. In this way, a particularly suitable method for generating spin magnetometry data is achieved.

The signal recorded with the spin magnetometer used in the present invention is formed from a first signal component, which is caused by the nuclear spin moments of the sample, and from a second signal component, which is caused by the nuclear spin moments of the sample environment, the second signal component being used as a reference signal for the first signal component. This means that the nuclear spin moments of the sample and the nuclear spin moments of the sample environment preferably have different or distinguishable resonant frequencies in the magnetic field. In the case of low sample concentrations in the sample environment, only a weak first signal component which is the desired measurement signal, is generated. By considering the relatively strong second signal component as a reference signal, it is ensured that a nuclear magnetic resonance spectrum of the sample can be successfully generated even with extremely low sample concentrations.

In one exemplary configuration, the detection spin moment has the spin quantum number equal to "1". The detection spin moment thus has a spin triplet with the spin states +1, 0 and −1. At least one detection spin moment is prepared according to the method by means of the initial pulse, in an X state, i.e. a superposition state consisting of the spin states +1 and −1. Thus, a particular state is generated at the start of each sequence. This prevents the magnetic field of the detection spin moment from acting as a gradient field on the sample nuclear spin moments to be measured. The high-frequency pulses of the sequence, including the initial pulses and final pulses, are in this case configured in particular as composite pulses, i.e. as a concatenation of individual high-frequency pulses, the individual high-frequency pulses acting on different spin transitions.

In another exemplary configuration, the sequence is generated as a decoupling sequence, in particular as dynamical decoupling, for the detection spin moment. The sequence duration, i.e. the time duration of the entire sequence, is in this case less than the relaxation time of the detection spin moment. The sequence configured, for example, as a Carr-Purcell-Meiboom-Gill (CPMG) sequence or as an XY sequence or as a spin-locking sequence, acts in this case, in particular, as a frequency filter for the detection spin moment. In particular, in this case, a decoupling sequence is used, by means of which the detection spin moment is sensitive to the Larmor frequencies of the nuclear spin moments. This way reliable detection of the transverse magnetisation is ensured in a straightforward process.

The detection spin moment is formed by an electron spin moment of a colour centre (quantum probe) of a solid or liquid body in contact with the sample. A colour centre is in this case intended to mean a point defect in the lattice structure of the body, which absorbs optically visible light. In the present example, the detection spin moment of the colour centre is optically polarisable, and a suitable detection spin moment is the electron spin moment of the colour centre, as mentioned and explained above. The colour centre has a spin-1 electron spin moment having a ground state with zero field splitting of 2.87 GHz between a nonmagnetic state ("0") and the associated magnetic states ("+1" and "−1"), so that relatively simple manipulation by means of irradiation of high-frequency pulses in the microwave range is made possible. In the event of illumination or irradiation with green (laser) light, the electron spin moment of the colour centre is on the one hand essentially fully polarised into the nonmagnetic ground state ("0"). On the other hand, the colour centre emits light in the red wavelength range in the event of excitation, while the number of photons being dependent on the spin state of the electron spin moment before the irradiation. In other words, the state of the electron spin moment of the colour centre can be optically or electronically read out by recording the emitted photons, so that particularly simple detection of the signal of the transverse magnetisation is possible.

The quantum probe, which is a NV centre in the present example, is suitably arranged close to the diamond surface, in particular at a distance range of a few nanometres to micrometres, and the sample being in contact with the diamond surface. In this way, it is ensured that the detection region of the detection spin moment extends sufficiently into the sample. Advantageously, the nuclear spin moments of the sample and of the sample environment may be hyperpolarised in the polarisation step in order to form the longitudinal magnetisation. Hyperpolarisation is in this case, in particular, intended to mean the generation of an ordered orientation of the nuclear spin moments in the sample far beyond the thermal equilibrium distribution (equilibrium magnetisation). Preferably, in this case a polarisation of the nuclear spin moments of at least 0.1%, preferably at least 1%, is achieved. In this way, on the one hand, a larger longitudinal magnetisation and therefore transverse magnetisation is generated, so that a signal-to-noise ratio is improved. This is then advantageously carried over to the signal quality of the nuclear magnetic resonance spectra generated.

The present application also relates to a point defects-based spin magnetometer for generating spin magnetometry data of the sample, processing the generated spin magnetometry data of a sample and providing information on the presence and properties of a particular compound in the sample, comprising:
a) a magnet for generating the static magnetic field;
b) a solid or liquid body having point defects with at least one integrated detection spin moment;
c) an antenna element for irradiating the frequency pulses to influence the nuclear spin moments and for irradiating the high-frequency pulses to influence the detection spin moment; and
d) the external memory for carrying out the method of the present invention.

In general, a point defects-based magnetometer utilises point defects in solid or liquid bodies, said defects are used as magnetometers either by using a single defect or an ensemble of defects. When the magnetometer is probing a time dependant magnetic field, such detector could serve as a spectrometer.

In the exemplary spin magnetometry method used in the present invention, the detection steps are carried out simultaneously on a plurality of detection spin moments. The step of polarisation and transfer ensures that during the detection steps of the repetitions there is essentially always an equal transverse magnetisation with the same initial phases in all detection regions of each detection spin moment. Consequently, for example, by means of wide-field recording (wide-field detection), it is possible to carry out the detection steps simultaneously, i.e. in parallel, on a plurality of detection spin moments. In this way, particularly rapid and reliable generation of the nuclear magnetic resonance spectrum is ensured. Furthermore, it is therefore also possible to reliably record transverse magnetisations with a relatively low amplitude.

The spin magnetometer used in the present invention is adapted for generating a nuclear magnetic resonance spectrum of nuclear spin moments of a sample in a sample environment. The device in this case comprises a magnet for generating a static magnetic field and a solid body having at least one integrated detection spin moment, as well as an antenna element and a controller. The controller in this case is adapted by program and/or circuit technology for carrying out the measurements as described above.

Thus, in the measurement scheme of a single experiment of the present invention, the sequence of probe operations consists of initialisation, evolution and measurement that is repeated many times under the constant presence of a spin magnetic signal. In each experiment, the frequency of the signal is equal to one of a few known frequencies, and the objective is actually to discriminate between the frequencies and/or to estimate them with the goal of getting analytical information and/or to identify molecular compounds.

Figure 1B:
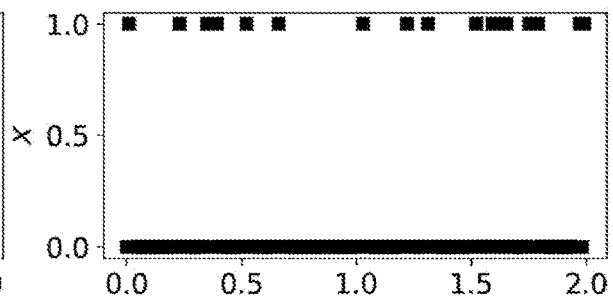
Figure 1C:
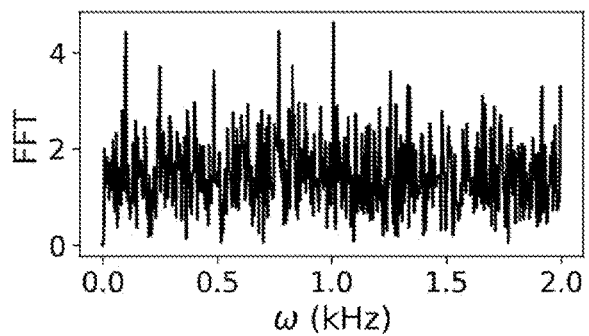
Figure 1D:
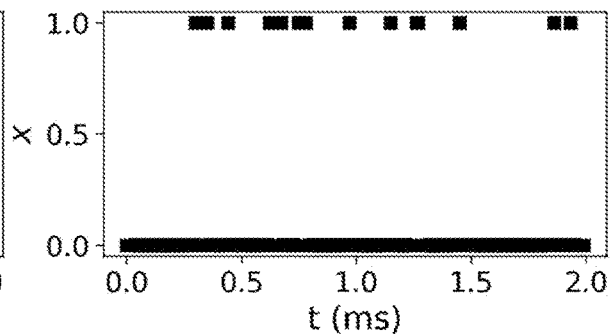

To evaluate the efficiency of the DL methods in terms of processing data generated with the spin magnetometry, two problems are solved by the present invention: frequency discrimination and frequency resolution. Ability of DL methods to discriminate between two signals corresponding to two different frequencies was first examined. In particular, data from signals that were read by a quantum probe, specifically a NV centre, which simulates noisy spin magnetometry data, was considered. Typical data for these two frequencies is shown in FIGS. 1a and 1c, which presents two different time traces of the datasets together with their Fourier transform shown in FIGS. 1b and 1d, respectively. Upon data analysis in FIGS. 1a-1d, it becomes very clear that it is impossible to discriminate between the two different frequencies using the Fourier transform alone because the signal has a strong phase noise on top of the detection noise.

As shown in the present invention, DL methods have an extremely steep learning curve. Therefore, in a relatively short time, which is only a few minutes, the DL methods are indeed able to classify the data with the same efficiency as Bayesian methods, which use the full knowledge of the signal and noise model and are numerically much more demanding. Moreover, the DL methods of the present invention outperform Bayesian learning methods when no knowledge of the signal or the noise model exists. Thus, the present invention employs the DL methods to tackle the problem of frequency resolution in a noisy environment. It has been surprisingly found in the present invention that the DL methods can efficiently discriminate between the signal of a single frequency and the signal of two nearby frequencies that have a strong amplitude and phase noise.

Frequency Discrimination: The Physical Model

An "input" to a neural network used in the method of the present invention is defined as a string or an array of measurement results generate with a spin magnetometer. The input is a string of classical bits (in case of a sing point defect) or integers (in case of an ensemble of point defects) $x_i$, where the value of each bit is either '0' or '1' corresponding to a non-successful and successful measurement of the quantum probe at time $t_1$ of the experiment, respectively, and where the value of each integer is any integer number corresponding to the measured frequency or amplitude. The latter is the case of many measurements done via an ensemble, and therefore, the generated spin data is an average of many point defects (quantum probes) in a form of a continuous output.

In the present invention, a chemical or biological compound generates a spectrum which is read by the point defects (spins). These defects are probed optically resulting in a '0' if there is no photon, or a '1' if a photon detected. Alternatively these could be probed by photoelectric detection in a coherent spin-state readout resulting in a binary result as well. Alternatively the readout could be done via an ensemble of defects resulting in a sum of the ones and zeros from all the detections. Therefore, in the method of the present invention, an input is either an array of binary values or an array of integers generated by the ensemble.

An "output" of a neural network used in the method of the present invention is defined as a single bit whose value is '0' or '1', or an array of bits, or an array of integers, or an array of complex numbers, wherein said single bit, or said array of bits, or said array of integers, or said array of complex numbers corresponds to an estimated frequency and/or an amplitude of the input.

In the present invention, a neural network is trained using a training dataset of inputs with known frequencies or amplitudes (labels). During the training, the parameters of the neural network are optimised to output the correct labels for the inputs in the training dataset. The goal of the training is thus to make the neural network learn the general relation between the inputs and outputs such that it would be able to output the correct label of a known input with the highest possible probability.

The DL method of the present invention is able to overcome the lack of knowledge of the physical model under supervised learning. As noted above, the objective is to use a train data set that contains inputs together with their known true labels (true outputs) in order to train a deep neural network such that the trained neural network is an optimised function, which outputs the correct labels for new inputs with the optimal (or near optimal) probability.

The problem of discrimination between at least two signals corresponding to at least two different frequencies by a single quantum probe is solved in the present invention. In a spin magnetometer setup, this corresponds, for example, to the scenario where a single point defect, which serves as a tiny magnetometer, is placed in the proximity of a sample that contains at least two known molecules between which one would like to discriminate. Specifically, in the presence of a single frequency signal (as single molecule), the Hamiltonian of the spin probe is given by:

$$H_{S_i} = g_i \cos(\omega_i t + \varphi_i) S_z \qquad (1),$$

where $g_i$, $\omega_i$ and $\varphi_i$ are the amplitude, frequency and random phase of signal i respectively, which is the standard setting in the spin magnetometry.

Figure 2A:
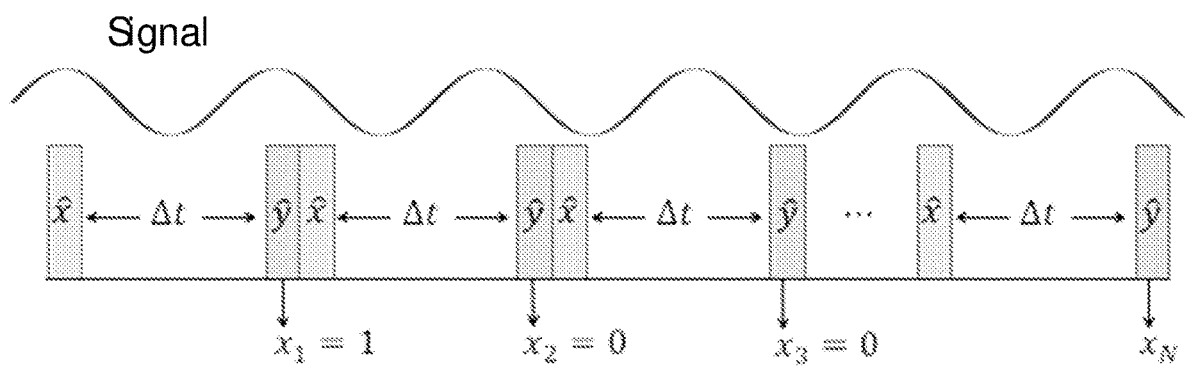
FIG. 2a schematically shows the signal in a form of a wavy line from a quantum probe, which is initially polarized along $\hat{x}$, freely evolves, according to Hamiltonian $H_{S_i}$ of the probe (see Eq. 1), under the signal, for a short duration $\Delta t$, and then is measured along $\hat{y}$. In the measurement scheme of a single experiment, the sequence of probe operations consists of initialisation ($\hat{x}$), evolution ($\Delta t$), and measurement ($\hat{y}$). This sequence is repeated N times under the constant presence of the signal and yields measurement results in a single classical bit which is denoted by $x_i$. The vector of the N bits ($x_1, x_2 \ldots x_N$) is the input of the DL method of the present invention.
Figure 2B:
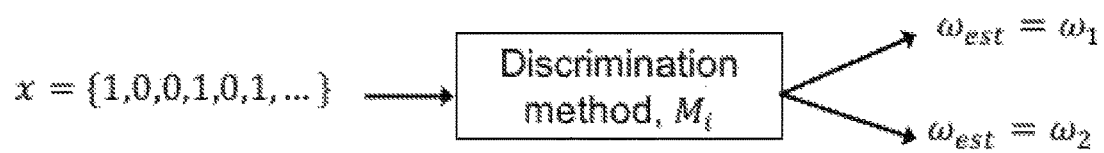
FIG. 2b schematically shows the method of the invention which allows to discriminate between two frequencies $\omega_1$ or $\omega_2$. In each experiment, the frequency of the signal is then equal to one of two known frequencies, $\omega_1$ or $\omega_2$. An exemplary experiment of the present invention results in a string of bits, for example x={1, 0, 0, 1, . . . }, which is an input of the method of the present invention. Given x, an estimation of the frequency of the signal, for example $\omega_{est}=\omega_1$ or $\omega_{est}=\omega_2$, is an output of the method.

Reference is now made to FIG. 2a showing a single experiment that results in a sequence of zeros ('0') and ones ('1'), which is represented by string of bits, for example $x = \{1, 0, 0, 1, \ldots\}$, where '1' and '0' correspond to a detection of the $m_s=0$ state or $m_s=1$ state of the NV centre. This string of bits corresponds to the measurement results of the quantum probe in a single shot experiment. The probe, which is initially polarised along $\hat{x}$, freely evolves according to $H_{S_i}$, as described in Eq. (1), for a short duration $\Delta t$, and then is measured along $\hat{y}$. In the measurement scheme of a single experiment, the sequence of probe operations consists of initialisation, evolution, and measurement, which is repeated many (N) times under the constant presence of a signal. In each experiment, the frequency of the signal is then equal to one of two known frequencies, $\omega_1$ or $\omega_2$. Given x, the objective is to obtain an estimation of the frequency of the signal by utilising a machine deep learning (DL)-based discrimination method. As shown in FIG. 2b, the result of the method of the present invention is actually an estimation of the frequency of the signal, for example $\omega_{est} = \omega_1$ or $\omega_{est} = \omega_2$. The probability for a successful measurement ('1') is given by:

$$P(t) = \sin[(g_i/2m)(\sin[w_i t + \varphi_i] \sin[\omega_i(t-\Delta t) + \varphi_i]) + \pi r/4]^2 \qquad (2),$$

The present inventors have recently found that when amplitude and phase are known (as in polarised NMR spectroscopy), it is possible to differentiate between two frequencies using only a single measurement. In the opposite limit used in the present invention, many measurements are required. Eq. (2) accounts for an ideal scenario with no noise or inefficiencies. It is assumed that in each experiment the signal corresponds to one of the known frequencies $\omega_i$, for example $\omega_1$ and $w_2$, and the amplitudes of the signals are known, but in each experiment the signal has an unknown uniformly distributed random phase. A single experiment then results in a string of bits, for example $x = \{1, 0, 0, 1, \ldots\}$, where '1' and '0' correspond to a detection of the $m_s=0$ state or $m_s=1$ state of the NV centre. Given x, an estimation of the frequency of the signal, for example $\omega_{est} = \omega_1$ or $\omega_{est} = \omega_2$, is what is required. The performance of a discrimination method M is quantified by the error arobability of the freauencv estimation. which is defined by:

$$P_M^{error} \equiv 0.5 \sum_{\substack{i=1 \\ j \neq i}}^{i=2} P_M(\omega_{est} = \omega_j \mid \omega_i), \qquad (3)$$

where $P_M(\omega_{est} = \omega_j | \omega_i)$ is the probability of a method M to output $\omega_{est} = \omega_j$, given that the frequency of the signal is $\omega_i$.

Frequency Discrimination: Full Bayesian Method

In the ideal scenario considered here, Eq. (1) provides full knowledge of the model, and the only unknowns are actually the random phases. Therefore, it is possible to simply utilise the likelihood-ratio test, known as a Full Bayesian ($M_{FB}$), where for each frequency the maximal log-likelihood is calculated over the random phase. That is, $$L_1 = \max_{\varphi_k} L(\varphi_k | x, \omega_1), \text{ and } L_2 = \max_{\varphi_k} L(\varphi_k | x, \omega_2) \qquad (4),$$

where $$L(\varphi_k | x, \omega_i) = \Sigma_j(x_j \log P(t_j, \omega_i, \varphi_k) + (1-x_j) \log(1 - P(t_j, \omega_i, \varphi_k))) \qquad (5$$

The frequency is estimated according to the larger likelihood; that is, if $L_1 > L_2$, then the value of $\omega_{est} = \omega_1$, otherwise $\omega_{est} = \omega_2$:

$$\omega_{est} = \begin{cases} \omega_1 & L_1 > L_2 \\ \omega_2 & \text{otherwise} \end{cases}$$

As $M_{FB}$ utilises the maximal information on the signal, it obtains the minimal possible error, which can serve as a benchmark to evaluate the efficiency of a learning method. Therefore, its error probability serves as a lower bound for the machine deep-learning (DL) method. It is known that Bayesian methods are optimal given the maximal amount of information. Moreover, given that the optimisation, they can be performed efficiently, which is usually not the case, particularly when considering a noisy environment. In order to verify that the machine DL method of the present invention is indeed optimal method, the results obtained in the present invention are compared with the results of an analytical calculation of the Fisher Information that can be performed in this case.

In general, full knowledge is not available due to either a lack of knowledge of the noise model in the experiment and detection inefficiencies, or lack of knowledge of the signal. In such case, according to the present invention, a correlation-based model $M_{corr}$ is utilised for frequency discrimination. To this end, a train set of measurement results $X_{train}$ is consequently used, for which the frequency of the signal is known. For each $x \in X_{train}$, the correlation vector $C_k = \langle x_i x_{i+k} \rangle_i$ is calculated, where the '0' bit is replaced by '−1'. Then, for each frequency the average correlation vector $$C^{\omega_i} = \langle C_k \rangle_{x \in X_{train}^{\omega_i}}$$

is calculated, where $X_{train} = X_{train}^{\omega_1} \cup X_{train}^{\omega_2}$. To estimate the frequency of an unknown signal, the correlation vector $C_k$ for this unknown signal is calculated, followed by calculation of distances:

$$D_1 = \|C_k - C^{\omega_1}\|_{L_2} \text{ and } D_2 = \|C_k - C^{\omega_2}\|_{L_2} \qquad (6),$$

by the $L_2$ norm. The frequency is estimated according to the smaller distance. It means that if the distance $D_1$ is less than $D_2$, then the estimated frequency $\omega_{est} = \omega_1$, otherwise $\omega_{est} = \omega_2$:

$$\omega_{est} = \begin{cases} \omega_1 & D_1 < D_2 \\ \omega_2 & \text{otherwise} \end{cases}$$

This method, however, disregards higher order correlation functions, the finite precision of the correlation functions that varies considerably between the nearest neighbours, and the higher neighbour separation. While at the limit, where all these effects are considered, the function should approach the optimum, it is numerically still very challenging to apply this model to many problems of interest.

Frequency Discrimination: Deep Learning (DL) Method

In accordance with the present invention, to overcome the model's lack of knowledge, a supervised DL model (hereinafter, "$M_{DL}$") is used. Similar to $M_{corr}$, a train dataset of measurement results of known signals (known labels) was used to train $M_{DL}$. The trained $M_{DL}$ was then applied to a test dataset and resulted in estimations of the frequencies of the test measurement results.

Figure 3A:
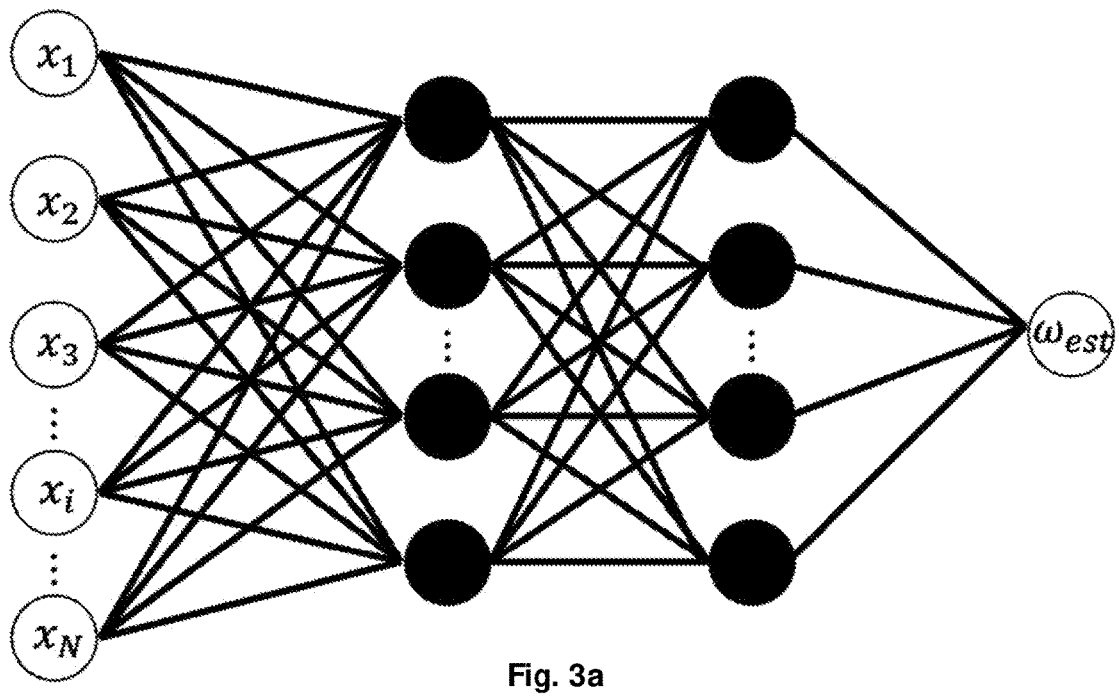
FIG. 3a schematically shows an exemplary $M_{DL}$ neural network of the present invention. The input layer inputs the measurement results x to the second layer, which is the first hidden layer. The output of the last hidden layer is fed to the output layer, which results in the frequency discrimination.

As an example, the present inventors employed a feed-forward neural network of several layers, preferably three or four layers. Reference is now made to FIG. 3a showing an exemplary embodiment of the $M_{DL}$ network of the present invention with one or two hidden layers. As shown in the figure, the first layer, which is defined as "an input layer", inputs the measurement results x to the second layer, which is the first hidden layer in this example. The neurons of the input layer output the input data, which is (in this example) the measurement results x of a single experiment, to the second layer. The output of the last hidden layer is fed to the output layer, which results in the frequency discrimination. Thus, the output of neuron j in the exemplified second hidden layer is given by:

$$f_j(z) = f(\Sigma_i \omega_{ij} x_i + b_j) \qquad (7),$$

where f is the activation function, and $\omega_{ij}$ and $b_j$ are the weights and biases, respectively.

For the hidden layers the rectified linear (ReLU) activation function $f(z) = \max(0, z)$ is used. The output of the second layer is then fed as an input to the next (third) layer and so on until the last layer (output) layer is reached. According to the present invention, the number of the hidden layers can be any, but at least one. In this model of the present invention, the output layer has at least one neuron having low and high activations levels associated with the two possible frequencies (labels). For the output neuron, the sigmoid activation function is used. The mean-squared error between the output of the learning model and the labels of the train set are used in the model of the present invention as the loss function that is minimised during the training by optimising the weights and biases of the model. Regarding the test dataset, after the application of the sigmoid activation function on the output of $M_{DL}$, the output is labelled by 1 or 0 dependent on whether the output value is >0.5 or <0.5, respectively. $P_{M_{DL}}$ is then calculated by the loss function (the mean-squared error) between the output labels and the true labels.

Figure 3B:
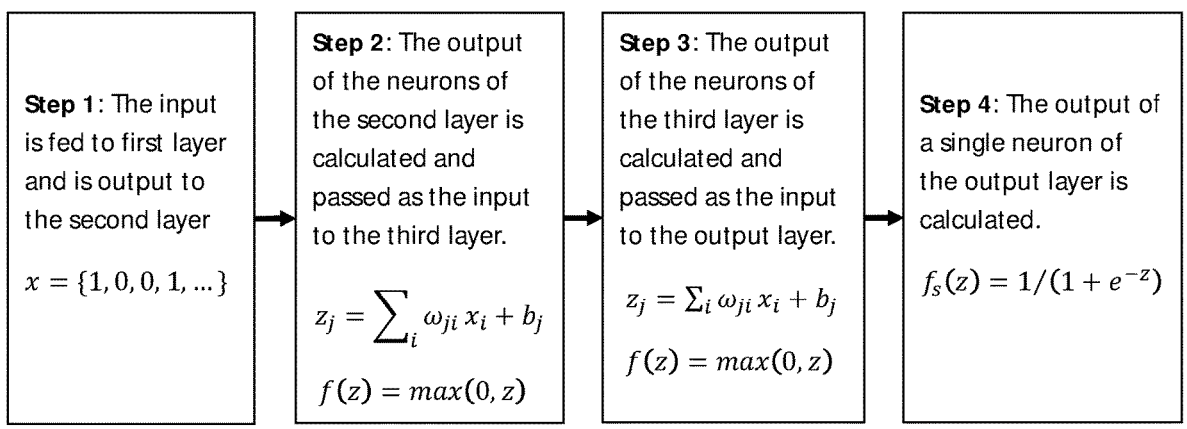
FIG. 3b shows the flowchart of the DL method of the present invention.

Thus, the deep-learning (DL) method performed on the nano-NMR measurement results in the external memory constitutes a further aspect of the present invention. Reference is now made to FIG. 3b showing the flowchart of the DL method of the present invention. Said DL method comprises the following steps:

Step 1: Feeding the input string into a neural network, wherein the value of node i in an input layer of said neural network is set to the value of bit $x_i$ in said input string, and outputting the values of the nodes of the input layer to subsequent hidden layers of said neural network, wherein said neural network contains an arbitrary number N of the hidden layers, wherein each hidden layer contains an arbitrary number $n_j$ of neurons, wherein each node i of the input layer outputs its value to all neurons j in a subsequent hidden layer, and wherein each neuron j of said hidden layer outputs its value to all neurons j in a subsequent hidden layer of said neural network;

Step 2: Calculation of the output of neurons in each subsequent hidden layer of said neural network, wherein the output of each neuron j in each said hidden layer is calculated as a function $f_j(z_j)$ of its inputs containing all the outputs of its preceding layer, wherein the function $z_j$ is a linear function of said inputs of a neuron j with different parameters for each neuron j, and wherein f (z) is a non-linear activation function; and Step 3: Calculation of the output of neurons in an output layer, wherein the output of each neuron j in the output layer is calculated as a function $f_s(z)$ of its inputs containing all the outputs of its preceding hidden N-layer, wherein the function $z_j$ is a linear function of said inputs of a neuron j with different parameters for each neuron j, wherein $f_s(z)$ is a non-linear activation function of the output neuron, and wherein the low and high activation levels of each neuron are associated with output labels: $f_s(z)$ larger than a threshold value and $f_s(z)$ less than a threshold value, said two labels correspond to the output values of '1' and '0', respectively.

As mentioned above, the number of the hidden layers N can be any, but at least one. In the present embodiment, the number of the hidden layers N=2, which is in no way limiting and serves only to simplify the description and embodiments of the invention. The number of neurons $n_j$ in the input layer is equal to the number of bits in the input string. In the example shown in the present invention, the second layer has $n_j$=20 neurons, the third layer has $n_j$=35 neurons, and the output layer has only one neuron. The value of threshold in the present example is 0.5.

As mentioned above, the following exemplary functions are used in the exemplary neural network of the present invention:

The linear function of the inputs $x_i$:

$$z_j = \Sigma_i \omega_{ji} x_i + b_j,$$

where $w_{ji}$ are the weights and $b_j$ is the bias of neuron j, the weights and biases are the free parameters of the neural network which are optimized during training of the network;

The rectified linear (ReLU) activation function:

$$f(z) = \max(0, z);$$

The sigmoid activation function:

$$f_s(z) = \frac{1}{1 + e^{-z}}$$

Upon training of the neural network of the present invention, the low and high activation levels of a single neuron were associated with at least the two possible frequencies (labels). For the output neuron, the aforementioned sigmoid activation function is used. The mean square error between the outputs of the neural network $\tilde{y}_i$ and the true labels (frequencies) $y_i$ are used as the loss function that is minimised during the training by optimising the weights and biases of the model. Thus, the mean square error (MSE) loss function is given by:

$$\frac{1}{n}\sum_{i=1}^{n}(y_i - \tilde{y}_i)^2,$$

where $\tilde{y}_i$ are the outputs of the neural network and $y_i$ are the true labels (frequencies) of the training inputs. In the exemplary training, a batch size of 50, a learning rate of $10^{-4}$ and the Adam optimiser were used as hyperparameters.

As mentioned above, the specific (exemplary) parameters of the neural network of the present invention are in no way limiting. They may further be fine-tuned and adjusted, including the number of hidden layers N, the number of neurons in each layer $n_j$, the activation function of each layer, the activation function of the output layer, the optimisation method and learning rate, and the addition of regularisation methods. In the example above the weights and biases where initialised randomly and independently (under the assumption of independent and identical random variables). A much better performance could be obtained by assuming correlations between the initial values of the weights and biases, especially between the weights and biases of far apart neurons. In addition, the neural network may not be only a fully connected network, but may include other types of networks as well, such as Convolutional Neural Networks (CNN) and Recurrent Neural Networks (RNN). In particular, a CNN whose kernel operates on neurons which are far apart from each other could result in an improved performance.

The DL method of the present invention can also be used for frequency estimation. This can be achieved by generalising the discrimination problem between two labels (frequencies) to a discrimination problem between a few to many labels (frequencies), where each label corresponds to a small frequency interval. In the case of X labels, the output layer would have X nodes ("one-hot encoding"). The structure of the neural network, including for instance the number of layers, number of nodes in each layer, type of activation functions and loss functions, might have to be adjusted in that case. For example, it could be more efficient to use the softmax activation function and the categorial cross-entropy loss function. Alternatively, frequency estimation could be achieved with a single output neuron by training the network to calculate a regression function.

Frequency Discrimination: Numerical Analysis

Figure 4:
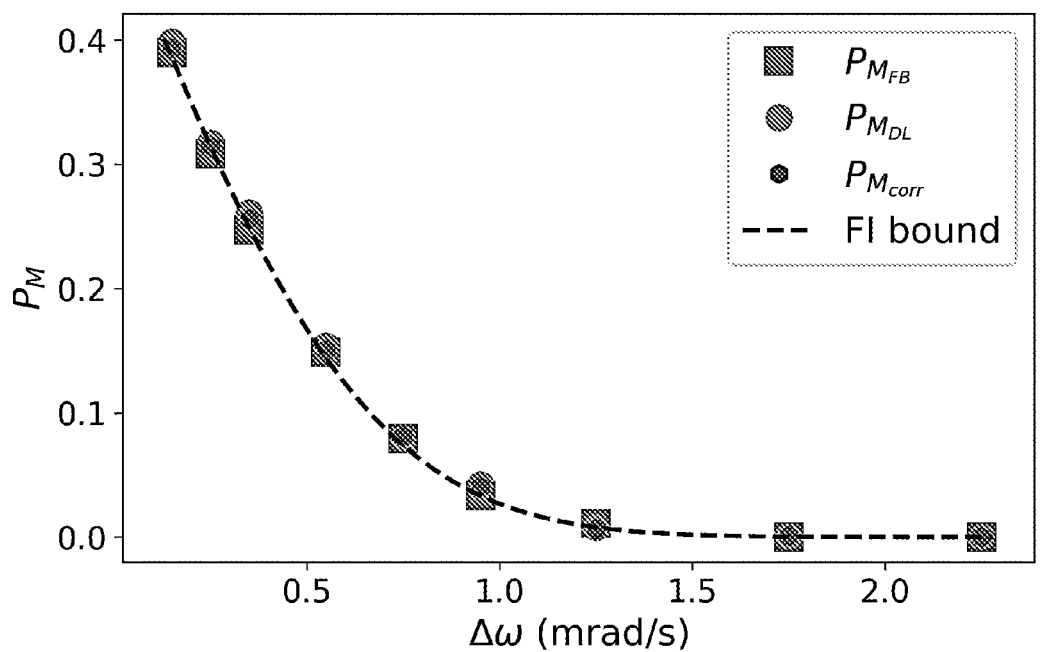
FIG. 4 shows discrimination error probabilities $P_{M_{FB}}$, $P_{M_{DL}}$, and $P_{M_{corr}}$ in the ideal model scenario as a function of the frequency difference $\Delta\omega$ between the two signals. Full Bayesian $P_{M_{FB}}$ (squares), deep learning $P_{M_{DL}}$ (circles), correlations $P_{M_{corr}}$ (hexagons) and analytical bound on $P_{M_{FB}}$ (dashed black) are plotted as a function of the frequency difference $\Delta\omega$. The input data sets were generated according to Eq. (1) with $g_1=g_2=\omega_1=10/(2\pi)$ Hz and with the frequency $\omega_t=\omega_1+\Delta\omega$, where $\Delta t=0.5$ sec and a total measurement time $T_{tot}=500$ sec (for 1000 measurements).

In order to test the performance of $M_{DL}$ in terms of frequency discrimination, numerical sets of measurement results x have been constructed using Eq. (2) for two different frequencies, where the phase $\varphi_i$ was chosen randomly (uniformly distributed between 0 and $2\pi$) for each x. The input data sets were generated according to Eq. (2) with $g_1 = g_2 = \omega_1 = 10/(2\pi)$ Hz and with the frequency $\omega_2 = \omega_1 + \Delta\omega$, where $\Delta t = 0.5$ sec and a total measurement time $T_{tot} = 500$ sec (for the set of 1000 measurements). Part of the datasets were used for training, while the remaining datasets were used for testing the learning model. The performance of the method $M_{FB}$ was compared to the performance of $M_{DL}$ and $M_{corr}$. Reference is now made to FIG. 4 showing the discrimination error probabilities $P_{M_{FB}}$, $P_{M_{DL}}$ and $P_{M_{corr}}$ in the ideal model scenario as a function of the frequency difference Xw between the two signals. Full Bayesian $P_{M_{FB}}$ (squares), deep learning $P_{M_{DL}}$ (circles), correlations $P_{M_{corr}}$ (hexagons) and analytical bound on $P_{M_{FB}}$ (dashed black) are plotted as a function of the frequency difference $\Delta\omega$.

In this model, the following layers were considered: a first layer of 1000 measurements (nodes), a second layer of 20 nodes, and a third layer of 35 nodes. This choice of number of nodes limits the free variable space and makes it possible to avoid overfitting without resorting to regularisation methods. As seen in FIG. 4, in the ideal scenario, both $M_{corr}$ and $M_{DL}$ approach the optimal performance of $M_{FB}$ even though both methods have no a-priori information on the physical model. This experiment corresponds to the case of a phase noise, where the random phase is different in each experiment, but it is fixed during each experiment (same phase within a single experiment, different phases in different experiments).

In order to provide indications on the performance of $M_{DL}$ in real-world noisy scenarios, a few more noise models were considered in the present invention. It is assumed that these noise models are "unknown" and hence, they are not considered in the Bayesian methods $M_{FB}$ and $M_{corr}$, which remain unchanged as described above. This serves as an indication on how much better the performance of $M_{DL}$ could be in comparison to $M_{FB}$ and $M_{corr}$ in a real-world scenario when the noise model is truly unknown to some extent. The first noise model is still a phase noise. While it was previously considered that the random (uniformly distributed) phase of the signal is constant during a single experiment, herein a scenario in which the random phase is changed once during a single experiment is considered and where the second random phase is also uniformly distributed. Moreover, the time interval in which the phase change occurs is also uniformly distributed between the time intervals of a single experiment (with 1000 time-intervals).

Figure 5A:
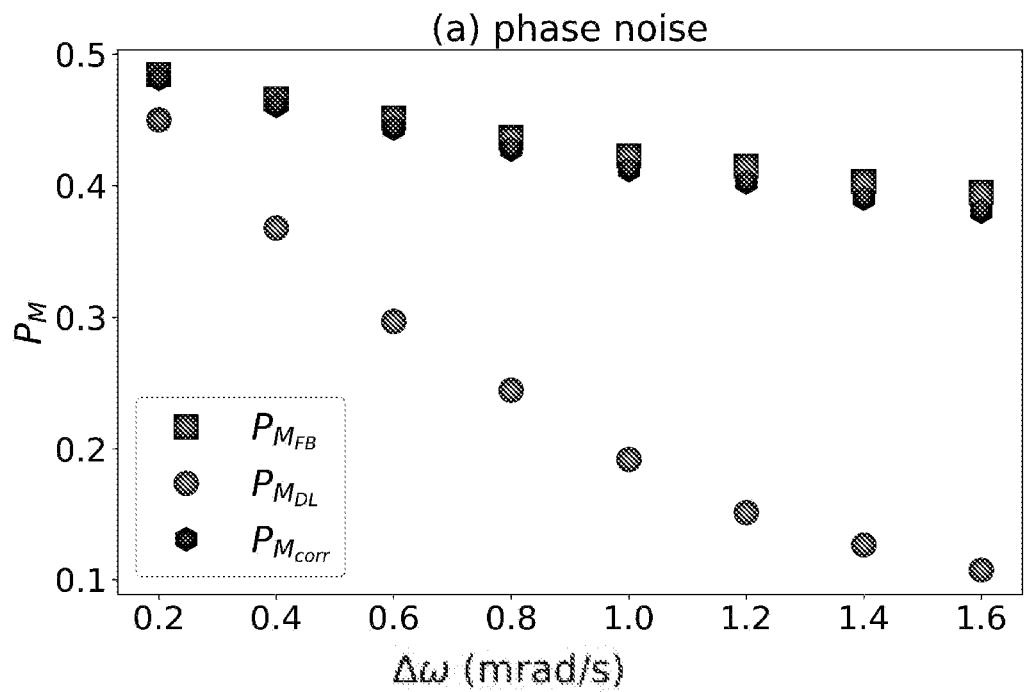
FIGS. 5a-5d show discrimination error probabilities $P_{M_{FB}}$, $P_{M_{DL}}$, and $P_{M_{corr}}$ as a function of the frequency difference $\Delta\omega$ between the two signals in noisy frequency-resolution scenarios. Full Bayesian $P_{M_{FB}}$ (squares), deep learning $P_{M_{DL}}$ (circles) and correlations $P_{M_{corr}}$ (hexagons) are plotted as a function of the frequency difference $\Delta\omega$.
Figure 5B:
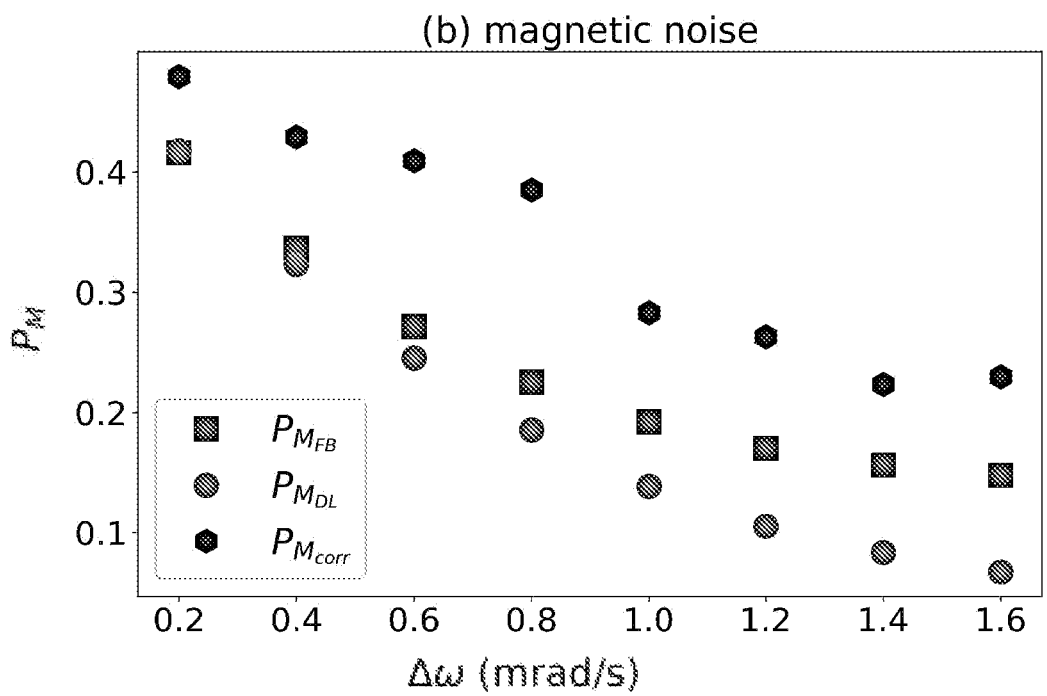
Figure 5C:
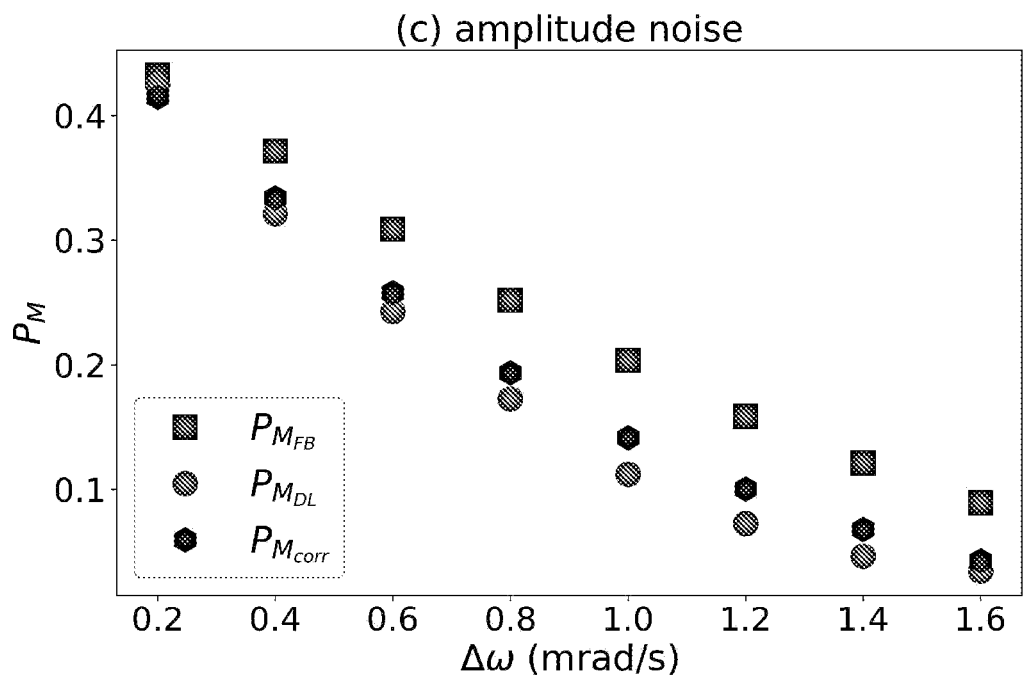
Figure 5D:
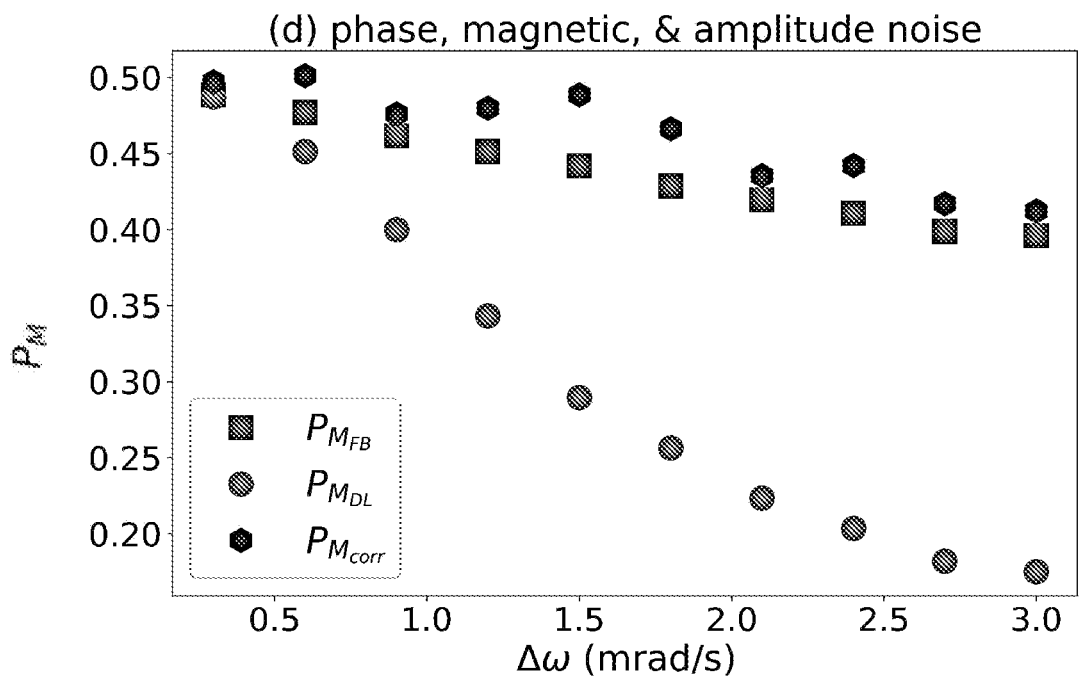

In this regard, reference is made to FIGS. 5a-5d demonstrating the discrimination error probabilities $P_{M_{FB}}$, $P_{M_{DL}}$, and $M_{corr}$ as a function of the frequency difference $\Delta\omega$ between the two signals in noisy scenarios. FIG. 5a shows a phase noise, where the random phase of the signal is randomly changed once during a single experiment at a random time interval, so there are two random values of the phase during a single experiment, and the time interval during the experiment in which the phase is changed is also random. FIG. 5b shows a magnetic noise, where the quantum probe is subjected to a random magnetic field, which is randomly changed once during a single experiment at a random time interval, so there are two random values of the magnetic noise during a single experiment, and the time interval during the experiment in which the magnetic noise is changed is also random. FIG. 5c shows an amplitude noise, where the amplitude of the signal has a different (random) value in each time interval of a single experiment. FIG. 5d shows a mixed noise scenario, which includes all of the above noise models.

It is clear that while the phase noise damages the discrimination capability of $M_{FB}$ and $M_{corr}$, $M_{DL}$ is capable of learning the noise model. The noise model shown in FIG. 5b considers a magnetic noise δb, which modifies the Hamiltonian of the probe in Eq. (1) to Eq. (8):

$$H_{S_i} = g_i \cos(\omega_i t + \varphi_i) S_z + \delta b S_z \qquad (8).$$

Similar to the phase noise, it is assumed that δb is changed once during a single experiment and that the time interval in which the change of δb occurs is uniformly distributed between the time intervals of a single experiment. Each of the two values of δb is normally distributed with a zero mean and a standard deviation of $\sigma = g_i/5 = 2/(2\pi)$ Hz. In this case, the $M_{DL}$ handles the magnetic noise better that $M_{FB}$ and much better than $M_{corr}$.

In the noise model shown in FIG. 5c, noise is considered in the amplitude of the signal. Specifically, it is assumed that the amplitude value is different in each time interval and that it is normally distributed with a mean of $g = 10/(2\pi)$ Hz (the previous value of the non-noisy amplitude) and a standard deviation that is equal to the mean value, that is, $\sigma = g = 10/(2\pi)$ Hz. In this case, the $M_{DL}$ performs slightly better than $M_{corr}$ and better than $M_{FB}$.

Lastly, the mixed-noise scenario shown in FIG. 5d is considered where all of the above three noise models are included. It is apparent that $M_{DL}$ is still capable of learning the noise model while the performance of $M_{FB}$ and $M_{corr}$ is severely degraded when assuming that we have no further knowledge on the noise model. Of course, in case that we have more knowledge on the noise model, we may be able to modify the Bayesian methods accordingly. However, the implication of such a modification is that the optimisation is performed with respect to a larger set of free variables, and therefore implies longer run times while the DL run time remains unchanged. Moreover, the above results suggest that Bayesian method could be very sensitive to the noise model; a minor unknown difference between the true noise model and the assumed noise model could result in a significantly reduced performance of the Bayesian method (for example, when there are three phase changes in a single experiment instead of two).

Experimental Verification

As mentioned above, the NV centre in diamond is one of the best quantum probe systems recently discovered for sensing, imaging and spectroscopy. The present example shows frequency discrimination of measurement results obtained by a single NV centre at ambient conditions.

Two artificial signals were produced by a signal generator with two different exemplary frequencies $\omega_1 = 2\pi \times 250$ Hz and $\omega_2 = 2\pi \times 251.6$ Hz. Each signal was measured for a total time of measurements $T_{tot} = 220$ sec, with a time interval of $\Delta t = 10$ μs. From the obtained row data, strings of 25,000 measurement results were generated (at $T_{tot} = 0.25$ sec), such that the phase corresponding to each x could be considered an entirely random phase (with no phase relation), and the frequencies could not be resolved by a Fourier transform (see FIGS. 1a and 1c). The low photon-detection efficiency of a true detection ($m_s = 0$) and a false detection ($m_s = 1$) was found to be approximately 7.4% and approximately 5.2%, respectively, thus indicating a relatively low signal-to-noise ratio (SNR) and low contrast.

In order to achieve a theoretical bound on the discrimination error, a theoretical model with a modified probability was considered for a successful measurement, which is given by:

$$Q(t) = \eta_{true}(t) + \eta_{false}[1 - P(t)] \qquad (9),$$

where P(t) is given by Eq. (2), and $\eta_{true}$ and $\eta_{false}$ are the true and false detection efficiencies, respectively.

Assuming that $\eta_{false} = 0.7 \eta_{true}$, numerical datasets were constructed using Eq. (9), and the amplitudes of the signals $g_1$ and $g_2$ and the efficiency $\eta_{true}$ were set for each signal to match the experimental results according to two constraints:

(i) The power spectrum at the frequency of the signal of the numerical data was required to be approximately equal to the power spectrum of the experimental data; and (ii) The average of the experimental and numeric signals fulfilled $\langle x \rangle = (\eta_{true} + \eta_{false})/2$.

Figure 6:
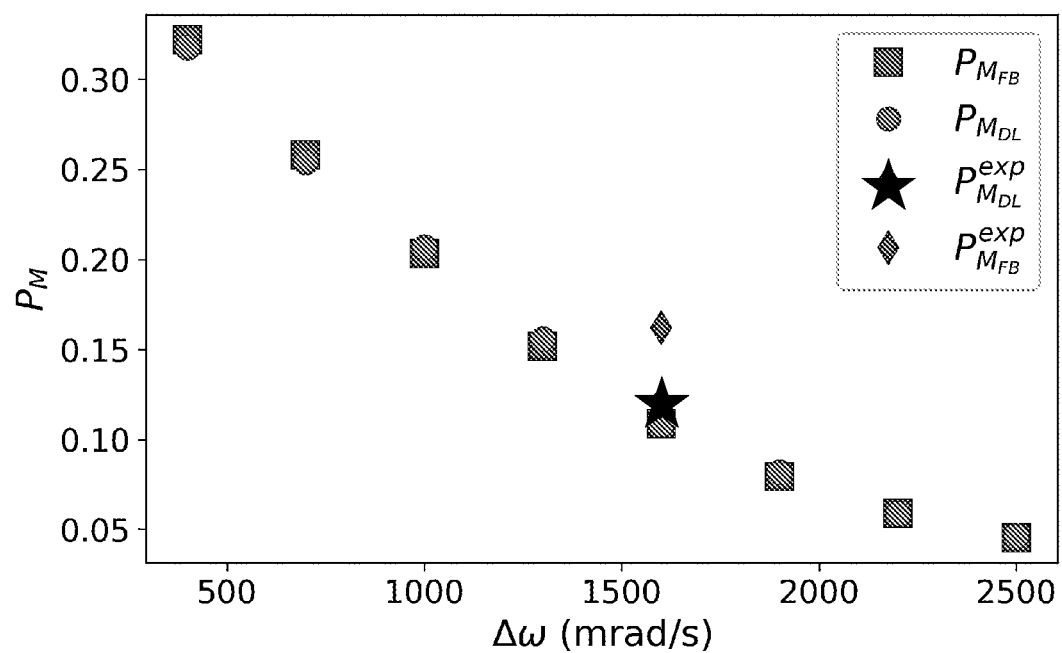
FIG. 6 shows discrimination error probabilities $P_{M_{FB}}$, $P_{M_{DL}}$ and $P_{M_{corr}}$ in the low-efficiency model scenario as a function of the frequency difference $\Delta\omega$ between the two signals. Full Bayesian $P_{M_{FB}}$ (squares) and deep learning $P_{M_{DL}}$ (circles) on numerical data, full Bayesian $P_{M_{FB}}^{exp}$ (rhombus) and deep learning $P_{M_{DL}}^{exp}$ (star) on the experimental DL data are plotted as a function of the frequency difference $\Delta\omega$. The input numerical data were generated according to Eq. (9) with $g_1=12.5$ kHz, $g_2=11.25$ kHz, $\omega_1=250$ Hz, $\omega_2=\omega_1+\Delta\omega$, where $\Delta t=10$ μsec and a total measurement time $T_{tot}=0.25$ sec (for 25,000 measurements).

Reference is now made to FIG. 6 showing the discrimination error probabilities $P_{M_{FB}}$, $P_{M_{DL}}$ and $P_{M_{corr}}$ calculated according to Eq. (3) in the low-efficiency model scenario as a function of the frequency difference $\Delta\omega$ between the two signals. Full Bayesian $P_{M_{FB}}$ (squares) and deep learning $P_{M_{DL}}$ (circles) calculated on numerical data, and full Bayesian $P_{M_{FB}}^{exp}$ (rhombus) and deep learning $P_{M_{DL}}^{exp}$ (star) calculated on the experimental DL data are plotted as a function of the frequency difference $\Delta\omega$. The input numerical data were generated according to Eq. (9) with $g_1 = 12.5$ kHz, $g_2 = 11.25$ kHz, $\omega_1 = 250$ Hz, and $\omega_2 = \omega_1 + \Delta\omega$, where $\Delta t = 10$ μsec and a total measurement time $T_{tot} = 0.25$ sec (for the entire set of 25,000 measurements).

As clearly seen in FIG. 6, for the numerical model, the probability $P_{M_{FB}}$ was found to be approximately 10.8%, and $P_{M_{DL}}$ was found to be approximately 11.6%. These results are consistent with the experimental data, for which the $P_{M_{DL}}^{exp}$ value of approximately 12.1% was received, thus reaching $P_{M_{FB}}$ without having any information on the model. The full Bayesian method performed on the experimental data obtained the $P_{M_{FB}}^{exp}$ value of approximately 16.2%. This difference is due to the fact that the experimental statistics differ slightly from the present probability function. While for the Bayesian method this creates a problem, the DL method of the present invention is able to learn this difference and take it into account. This difference is expected to be much more dramatic in real spin magnetometry experiments in which there are much more uncertainties of the model.

In addition, $P_{M_{FB}}$ and $P_{M_{DL}}$ were analysed on the numerical data as a function of the frequency difference $\Delta\omega$ (see FIG. 6). It is worth noting that due to the relatively large window size of 25,000 measurements, a full analysis of $M_{corr}$ is not possible within a reasonable time scale with a regular computer. Partial analysis of $M_{corr}$ (considering segments of two-point correlations only) for both the numerical model and the experimental data yielded the $P_{M_{corr}}$ probability approximately larger than 0.4. This indicates that the DL method of the present invention could indeed be a way better choice for the spin magnetometry when there is a lack of knowledge on the model.

Frequency Resolution

The problem of discrimination between a spin magnetic signal with a single frequency and a signal with two proximal frequencies centred at the value of the single frequency is also solved in the present invention.

Figure 7:
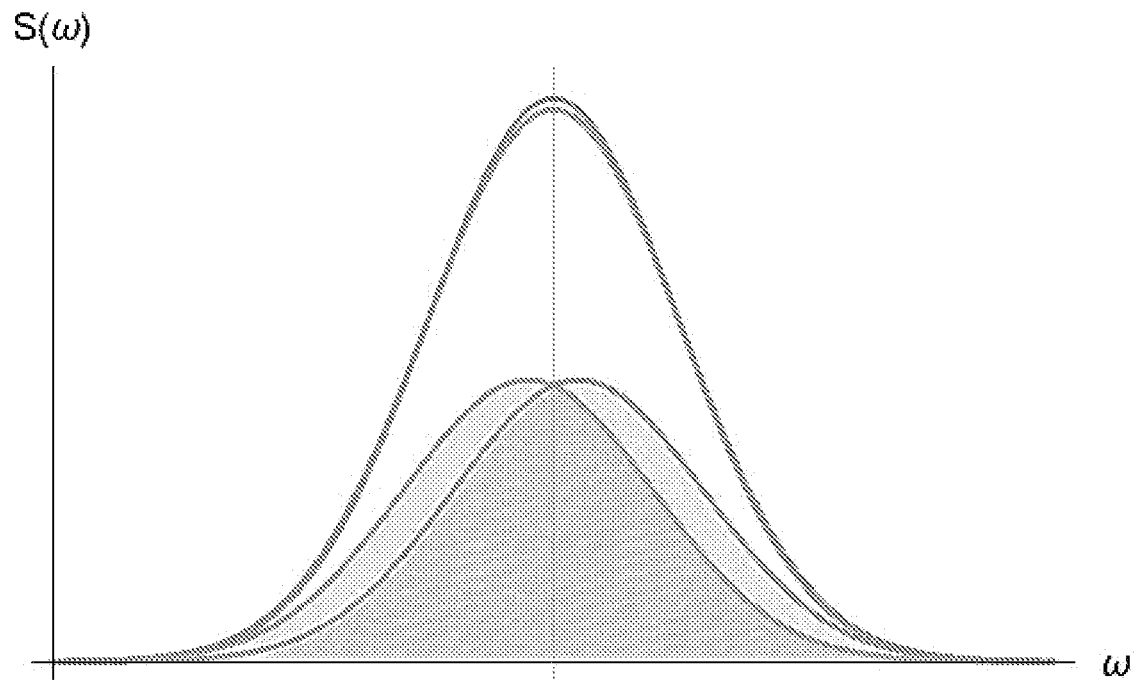
FIG. 7 illustrates the problem of frequency resolution.

Reference is now made to FIG. 7 illustrating the problem of frequency resolution. The observed signal could be one of two possible signals that should be resolved. One signal (the first upper curve) has two nearby frequencies (two lower curves) and corresponds to their sum. The second signal (the second upper curve overlapping with the first upper curve) has one frequency, which is centred between the two nearby frequencies of the first signal. The closer the two frequencies are, the harder it is to resolve between the two signals.

It is assumed that the signals have strong amplitude and phase noise, which the present inventors modelled by the Ornstein-Uhlenbeck process for the NV-probed unpolarised spin magnetometry experiments. Specifically, the Hamiltonian of the quantum probe is given by:

$$H = \left(\sum_{i=1}^{n} A_i(t)\cos[\delta_i t] - B_i(t)\sin[\delta_i t]\right) S_z, \quad (10)$$

where $A_i$ and $B_i$ undergo an Ornstein-Uhlenbeck (OU) process. The probability for the successful measurement (returning value "1") is then:

$$P(t) = \sin\left[\sum_{i=1}^{n} \frac{A_i(t)}{\delta_i}(\sin[\delta_i t] - \sin[\delta_i(t-\Delta t)]) + \frac{B_i(t)}{\delta_i}(\cos[\delta_i t] - \cos[\delta_i(t-\Delta t)]) + \frac{\pi}{4}\right]^2, \quad (11)$$

where $n=2$ and $\delta_i = \delta_c \pm \Delta/2$. For two frequencies, $\Delta$ is finite, and for a single frequency, $\Delta=0$.

Frequency Resolution: Numerical Analysis

Numerical datasets were constructed according to Eq. (11), where $A_i(t)$ and $B_i(t)$ follow the OU process with mean value $\mu=0$, volatility $\sigma=(\pi/10)\sqrt{(4/\pi T_2)}$ and reversion speed $\theta=1/T_2$, where $T_2=256$ sec is the coherence time of the signal. In addition, the following values were fixed: $T_{tot}=2T_2$ and $\Delta t=1$ sec. The performance of $M_{DL}$ was tested as a function of the frequency difference $\Delta$ in comparison to $M_{FB}$ and $M_{corr}$. In $M_{FB}$, the maximal log-likelihood was calculated over the random OU processes. For each string of measurement results x, the single frequency signal with $\Delta=\Delta_0=0$ and the signal of two near-by frequencies with $\Delta=\Delta_n>0$ were considered, where $\Delta_n$ corresponds to a numerical value of the frequency difference between the two frequencies. Many sets of random OU processes were generated, denoted by $O_k$ and calculated:

$$L_1 = \max_{O_k} L(O_k|x,\Delta_0), \text{ and } L_2 = \max_{O_k} L(O_k|x,\Delta_n) \quad (12),$$

where $$L(O_k|x,\Delta_i) = \Sigma_j(x_j \log P(t_j,\Delta_i,O_k) + (1-x_j)\log(1-P(t_j,\Delta_i,O_k))) \quad (13).$$

The signal is estimated as a single frequency signal or as a signal of two frequencies according to the larger likelihood; that is $$\Delta_{est} = \begin{cases} \Delta_0 & L_1 > L_2 \\ \Delta_n & \text{otherwise} \end{cases}$$

Figure 8:
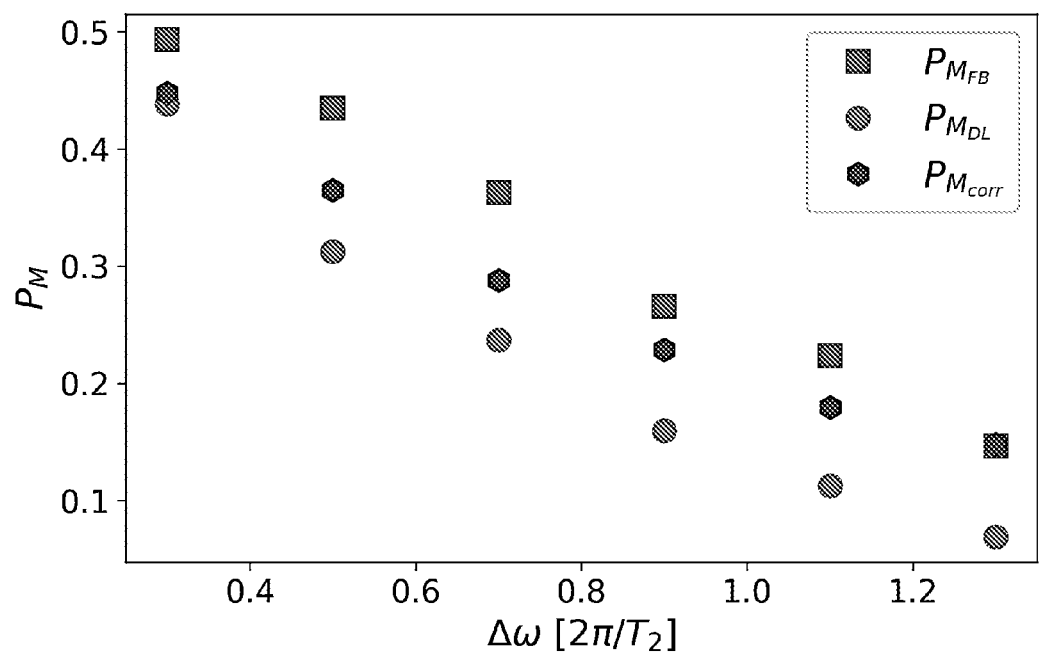
FIG. 8 shows discrimination error probabilities $P_{M_{FB}}$, $P_{M_{DL}}$ and $P_{M_{corr}}$ as a function of the frequency difference $\Delta\omega$ between the two signals in the noisy frequency-resolution scenario. Full Bayesian $P_{M_{FB}}$ (squares), deep learning $P_{M_{DL}}$ (circles) and correlations $P_{M_{corr}}$ (hexagons) are plotted as a function of the frequency difference $\Delta\omega$. The input data sets were produced according to Eq. (11) with $T_{tot}=2T_2$.

Reference is now made to FIG. 8 showing the discrimination error probabilities $P_{M_{FB}}$, $P_{M_{BL}}$ and $P_{M_{corr}}$ in the noisy frequency-resolution scenario as a function of the frequency difference $\Delta\omega$. Full Bayesian $P_{M_{FB}}$ (squares), deep learning $P_{M_{DL}}$ (circles) and correlations $P_{M_{corr}}$ (hexagons) are plotted as a function of the frequency difference $\Delta\omega$. The input data were produced according to the above Eq. (11) with $T_{tot}=2T_2$. FIG. 8 shows a phase noise, where the random phase is different in each experiment, but it is fixed during each experiment (same phase within a single experiment, different phase in different experiments). The $M_{DL}$ results are clearly better than the results of $M_{corr}$, as well as the results of $M_{FB}$. While $M_{DL}$ and $M_{corr}$ could reach a result within approximately 45 min, the $M_{FB}$ model did so within approximately 7 hours (the CPU times, both considered on the same common computer without utilising the graphic processing unit). These numerical results provide a strong indication that the DL methods are suitable for molecular identification of various chemical and biological compounds based on their spin magnetic signal extremely fast. This allows to use the instant DL methods of the present invention in conjunction with the spin magnetometry technique as a useful tool in probing chemical reactions at the nano scale. This also allows to use the DL methods of the present invention in conjunction with the spin magnetometry as an invaluable analytical tool for identifying the ultimate limit of resolution problems.

Thus, the present invention solves the problem of the low signal-to-noise ratio observed in the spin magnetometry measurements. It has been surprisingly found by the present inventors that the noise that goes hand in hand with spin magnetometer setups can be handled efficiently by various DL methods. The obtained results can be seen as a strong indication that the DL methods are actually the methods of choice when analysing spin magnetometry data in a variety of scenarios and in a variety of applications, including chemical shifts, J-couplings and real-time molecular analysis. The present invention clearly shows that DL methods can effectively learn the physical and noise models and by that constitute an efficient alternative to Bayesian methods, which require a priori knowledge on the physical and noise models.

While certain features of the present application have been illustrated and described herein, many modifications, substitutions, changes, and equivalents will be apparent to those of ordinary skill in the art. It is, therefore, to be understood that the appended claims are intended to cover all such modifications and changes as fall within the true spirit of the present application.

The invention claimed is:

1. A method for processing spin magnetometry data of a sample and for providing information on a particular compound in the sample, said method comprising:
   a) subjecting a sample to a spin magnetometry measurement with a point defects-based spin magnetometer to generate a string or an array of spin measurement results of the sample, the string or array of the spin measurement results being an input to an external memory device; and
   b) applying a deep-learning method on the spin measurement results in the external memory device to output a single bit whose value is '0' or '1', an array of bits, array of integers, or an array of complex numbers, wherein said single bit, said array of bits, said array of integers, or said array of complex numbers corresponds to an estimated frequency and/or an amplitude of the input to the external device, thereby providing information on said compound in the sample.

2. The method of claim 1, wherein said point defects-based spin magnetometer is selected from a group consisting of a nitrogen-vacancy centres ($NV^-$)-based spin magnetometer, a germanium-vacancy centres ($GeV^-$)-based spin magnetometer, a silicon-vacancy centres ($SiV^-$)-based spin magnetometer, a ST1 centres-based spin magnetometer, a group-III nitrides-based spin magnetometer, and a silicon carbide-based spin magnetometer.

3. The method of claim 2, wherein said group-III nitrides are selected from boron nitride, gallium nitride and aluminium nitride.

4. The method of claim 1, wherein the string or the array of the spin measurement results of the sample is generated from a nuclear magnetic resonance spectrum of nuclear spin moments of the sample placed in a static magnetic field which permeates the sample, and from at least one detection spin moment having a detection region which encloses the static magnetic field and extends at least partially into the sample.

5. The method of claim 1, wherein the step of subjecting the sample to a spin magnetometry measurement with the point defects-based spin magnetometer to generate a string or an array of the spin measurement results of said sample further comprises:
   a) placing the sample in a static magnetic field which permeates the sample and polarising or hyperpolarising at least some nuclear spin moments of the sample along the magnetic field for creating longitudal magnetisation;
   b) converting said longitudal magnetisation into transverse magnetisation by irradiating frequency pulses with a 90° flip angle, thereby influencing said nuclear spin moments;
   c) irradiating a sequence of high-frequency pulses having an initial pulse and a final pulse onto at least one detection spin moment, thereby influencing said detection spin moment, and subsequently recording a signal of said transverse magnetisation present in a detection region of the sample; and
   d) repeating c) several times in succession, wherein said initial pulse and said final pulse of said each sequence have a pulse phase which is the same.

6. The method of claim 5, wherein the detection spin moment has a spin quantum number 1 and is prepared in an initial state by means of said initial pulse.

7. The method of claim 5, wherein said each sequence is generated as a decoupling sequence for the detection spin moment, in which a number of high-frequency pulses with 180° flip angles are provided between said initial pulse and said final pulse.

8. The method of claim 5, wherein said detection spin moment is formed by an electron spin moment of a point defect of a solid or liquid body in contact with the sample.

9. The method of claim 8, wherein said point defect is selected from a group consisting of a nitrogen-vacancy centre of a diamond or of a diamond assembly, a germanium-vacancy centre, a silicon-vacancy centre, a ST1 centre, a group-III nitride centre, and a silicon carbide centre.

10. The method of claim 9, wherein said group-III nitrides are selected from boron nitride, gallium nitride and aluminium nitride.

11. The method of claim 5, wherein repeating step c) is carried out simultaneously on a plurality of the detection spin moments.

12. The method of claim 1, wherein the method is suitable for measuring the sample at nanomole, picomole, femtomole or attomole sample scales.

13. The method of claim 1, wherein the deep-learning method is for employing a neural network selected from a group consisting of a fully connected neural network, a convolutional neural network, a recurrent neural network, a ResNet neural network, and a neural network with attention heads.

14. The method of claim 1, wherein the deep-learning method further comprises training of a neural network, on which said method is employed.

15. The method of claim 1, wherein the deep-learning (DL) method further comprises:
   a) feeding the input string into a neural network, wherein a value of node in an input layer of said neural network is set to the value of bit x, in said input string, and outputting the values of the nodes of the input layer to subsequent hidden layers of said neural network, wherein said neural network contains an arbitrary number N of the hidden layers, wherein each hidden layer contains an arbitrary number $n_j$ of neurons, wherein each node i of the input layer outputs its value to all neurons j in a subsequent hidden layer, and wherein each neuron j of said hidden layer outputs its value to all neurons j in a subsequent hidden layer of said neural network;
   b) calculating an output of neurons in each subsequent hidden layer of said neural network, wherein the output of each neuron j in each said hidden layer is calculated as a function $f_j(z_j)$ of its inputs containing all the outputs of its preceding layer, wherein the function $z_j$ is a linear function of said inputs of a neuron j with different parameters for each neuron j, and wherein $f(z)$ is a non-linear activation function; and
   c) calculating an output of neurons in an output layer, wherein the output of each neuron j in the output layer is calculated as a function $f_s(z)$ of its inputs containing all outputs of its preceding hidden N-layer, wherein the function $z_j$ is a linear function of inputs of a neuron j with different parameters for each neuron j, wherein $f_s(z)$ is a non-linear activation function of the output neuron, and wherein low and high activation levels of each neuron are associated with output labels: $f_s(z)$ larger than a threshold value and $f_s(z)$ less than a threshold value, said two labels correspond to the output values of '1' and '0', respectively.

16. The method of claim 14, wherein said DL method further comprises:
   a) feeding the input string into a neural network, wherein the a value of node in an input layer of said neural network is set to the value of bit x, in said input string, and each node of the neural network outputs its value to all nodes in a first hidden layer of said neural network;
   b) calculating an output of neurons in said first hidden layer, wherein the output of each neuron j in the first hidden layer is calculated as a function $f_j(z_j)$ of its inputs containing all the outputs of the input layer, wherein the function $z_j$ is a linear function of said inputs of a neuron j with different parameters for each neuron j, and wherein f(z) is a non-linear activation function;
   c) calculating an output of neurons in a second hidden layer, wherein the output of each neuron j in said second hidden layer is calculated as a function $f_j(z_j)$ of its inputs containing all the outputs of the first hidden layer, wherein the function $z_j$ is a linear function of said inputs of a neuron j with different parameters for each neuron j, and wherein f(z) is a non-linear activation function; and
   d) calculating an output of neurons in an output fourth layer, wherein the output of each neuron j in the output layer is calculated as a function $f_s(z)$ of its inputs containing all the outputs of the second hidden layer, wherein the function $z_j$ is a linear function of said inputs of a neuron j with different parameters for each neuron j, wherein $f_s(z)$ is a non-linear activation function of the output neuron, and wherein low and high activation levels of each neuron are associated with two output frequencies or amplitudes $f_s(z) > 0.5$ and $f_s(z) < 0.5$, said two frequencies or amplitudes correspond to the output values of '1' and '0', respectively.

17. The method of claim 1, wherein the deep-learning method is used to estimate a frequency in the spin magnetometry data of the sample.

18. The method of claim 1, wherein the external memory device is a mobile device, wearable gadget, smartphone, smartwatch, desktop computer, server, remote storage, internet storage or internet cloud.

19. The method of claim 1, wherein the external memory device comprises a processor, a microcontroller or a memory-storing controller suitable for storing executable instructions, which when executed by the processor cause the processor to perform the deep-learning method on the measurement results.

20. A point defects-based spin magnetometer for generating spin magnetometry data of a sample, processing generated spin magnetometry data of a the sample and providing information on a presence and properties of a particular compound in the sample, the point defects-based spin magnetometer comprising:
   a) a magnet for generating the static magnetic field;
   b) a solid or liquid body having point defects with at least one integrated detection spin moment;
   c) an antenna element for irradiating the frequency pulses to influence the nuclear spin moments and for irradiating the high-frequency pulses to influence detection of spin moment; and
   d) the external memory device for carrying out the method of claim 1.

* * * * *